(12) United States Patent
Yasuda et al.

(10) Patent No.: US 7,501,665 B2
(45) Date of Patent: Mar. 10, 2009

(54) SEMICONDUCTOR LIGHT EMITTING DEVICE AND METHOD OF MANUFACTURING SAME AND SEMICONDUCTOR LIGHT EMITTING APPARATUS

(75) Inventors: Hidefumi Yasuda, Kanagawa-ken (JP); Yuko Kato, Kanagawa-ken (JP); Kazuhiro Ikezawa, Kanagawa-ken (JP); Toshiyuki Terada, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 11/589,087

(22) Filed: Oct. 30, 2006

(65) Prior Publication Data
US 2007/0096116 A1 May 3, 2007

(30) Foreign Application Priority Data
Oct. 28, 2005 (JP) ............................ 2005-314056

(51) Int. Cl.
*H01L 33/00* (2006.01)
(52) U.S. Cl. ....................................... 257/98; 257/100
(58) Field of Classification Search ............ 257/98–100
See application file for complete search history.

(56) References Cited

U.S. PATENT DOCUMENTS

| | | | |
|---|---|---|---|
| 5,101,264 A * | 3/1992 | Kauchi et al. ................ | 257/100 |
| 6,495,862 B1 | 12/2002 | Okazaki et al. | |
| 6,504,180 B1 | 1/2003 | Heremans | |
| 6,787,383 B2 | 9/2004 | Ikeda et al. | |
| 7,342,246 B2 * | 3/2008 | Sugiura et al. ................ | 257/40 |
| 2006/0043399 A1 | 3/2006 | Miyagaki et al. | |

FOREIGN PATENT DOCUMENTS

JP 2004-243981 8/2004

OTHER PUBLICATIONS

U.S. Appl. No. 11/538,646, filed Oct. 4, 2006, Kato et al.
U.S. Appl. No. 11/589,087, filed Oct. 30, 2006, Yasuda et al.

* cited by examiner

*Primary Examiner*—Mark Prenty
(74) *Attorney, Agent, or Firm*—Oblon, Spivak, McClelland, Maier & Neustadt, P.C.

(57) ABSTRACT

A semiconductor light emitting device comprises: a semiconductor laminated body; an electrode provided on the first major surface of the semiconductor laminated body; and a reflecting layer provided on the second major surface side of the semiconductor laminated body. The semiconductor laminated body includes a light emitting layer and having a first major surface and a second major surface located on the opposite side of the first major surface. A light emitted from the light emitting layer is extracted from the first major surface. The reflecting layer is conductive and reflective of the light emitted from the light emitting layer. At least a portion of the reflecting layer, which is opposed to the electrode, has irregularities.

10 Claims, 22 Drawing Sheets

SEMICONDUCTOR LIGHT EMITTING DEVICE AND METHOD OF MANUFACTURING SAME AND SEMICONDUCTOR LIGHT EMITTING APPARATUS

CROSS-REFERENCE TO RELATED APPLICATION

This application is based upon and claims the benefit of priority from the prior Japanese Patent Application No.2005-314056, filed on Oct. 28, 2005; the entire contents of which are incorporated herein by reference.

BACKGROUND OF THE INVENTION

1. Field of the Invention

This invention relates to a semiconductor light emitting device and a method of manufacturing the same and a semiconductor light emitting apparatus, and more particularly to a semiconductor light emitting device and a method of manufacturing the same and a semiconductor light emitting apparatus comprising a reflecting layer by which light emitted from the light emitting layer to the opposite side of the light extraction surface is reflected to the light extraction surface side.

2. Background Art

A semiconductor light emitting device having a reflecting layer made of a metal material on the opposite side of the light extraction surface is disclosed, for example, in JP 2005-175462A. It is configured so that light emitted from the light emitting layer to the opposite side of the light extraction surface is reflected to the light extraction surface side by the reflecting layer.

The reflecting layer is intended to improve the light extraction efficiency. However, light emitted from the light emitting layer may undergo repeated total reflection at the reflecting layer, the device side face, and the light extraction surface. As a result, the improvement of light extraction efficiency is less than expected.

SUMMARY OF THE INVENTION

According to an aspect of the invention, there is provided a semiconductor light emitting device comprising: a semiconductor laminated body including a light emitting layer and having a first major surface and a second major surface located on the opposite side of the first major surface, a light emitted from the light emitting layer being extracted from the first major surface; an electrode provided on the first major surface of the semiconductor laminated body; and a reflecting layer provided on the second major surface side of the semiconductor laminated body, the reflecting layer being conductive and reflective of the light emitted from the light emitting layer, at least a portion of the reflecting layer having irregularities, the portion being opposed to the electrode.

According to other aspect of the invention, there is provided a semiconductor light emitting apparatus comprising: a mounting member; a semiconductor light emitting device mounted on the mounting member, the semiconductor light emitting device having: a semiconductor laminated body including a light emitting layer and having a first major surface and a second major surface located on the opposite side of the first major surface, a light emitted from the light emitting layer being extracted from the first major surface; an electrode provided on the first major surface of the semiconductor laminated body; and a reflecting layer provided on the second major surface side of the semiconductor laminated body, the reflecting layer being conductive and reflective of the light emitted from the light emitting layer, at least a portion of the reflecting layer having irregularities, the portion being opposed to the electrode; and a resin sealing the semiconductor light emitting device.

According to other aspect of the invention, there is provided a method of manufacturing a semiconductor light emitting device comprising: forming successively, on a first substrate, a semiconductor layer including a light emitting layer, and then a conductive layer; roughening a surface of the conductive layer; forming a first metal layer on the roughened surface of the conductive layer; bonding a second metal layer formed on a second substrate to the first metal layer, the second metal layer being bonded to the first metal layer in conjunction with the second substrate; and removing the first substrate after bonding the second metal layer to the first metal layer.

DETAILED DESCRIPTION OF THE INVENTION

Embodiments of the invention will now be described with reference to the drawings.

FIRST EMBODIMENT

Figure 1:
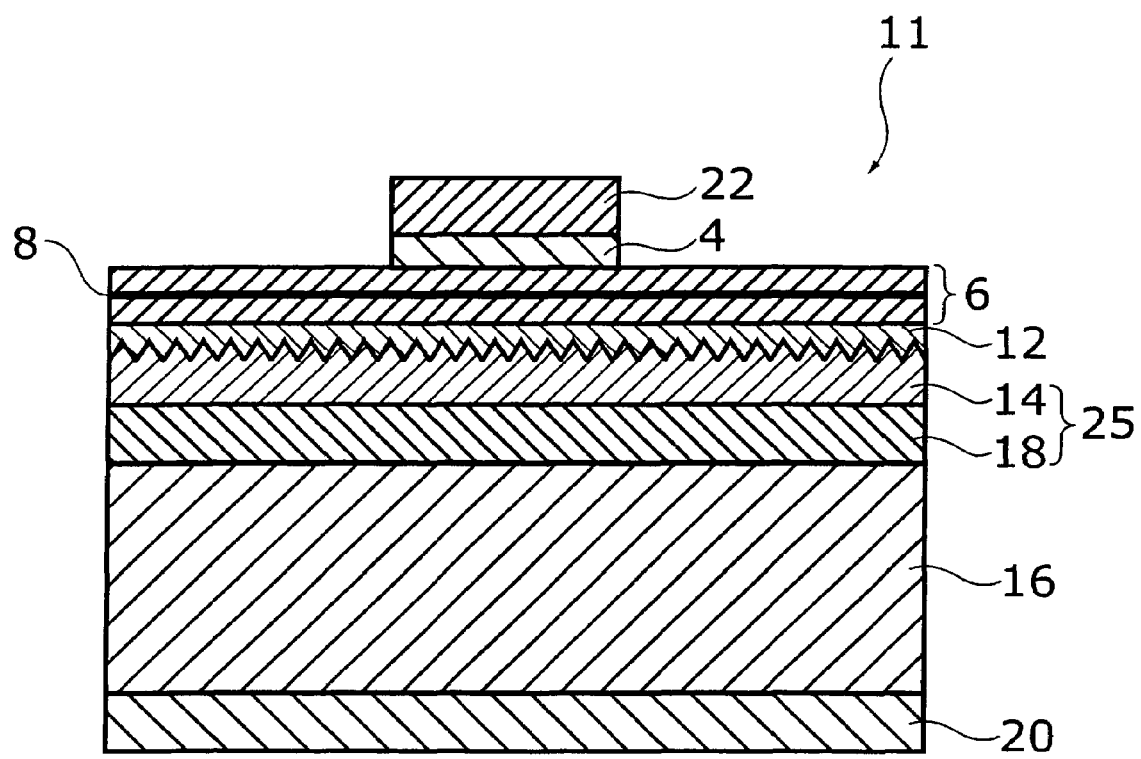
FIG. 1 is a schematic view illustrating the cross-sectional structure of the relevant part of a semiconductor light emitting device according to a first embodiment of the invention.

FIG. 1 is a schematic view illustrating the cross-sectional structure of the relevant part of a semiconductor light emitting device 11 according to a first embodiment of the invention.

Figure 2:
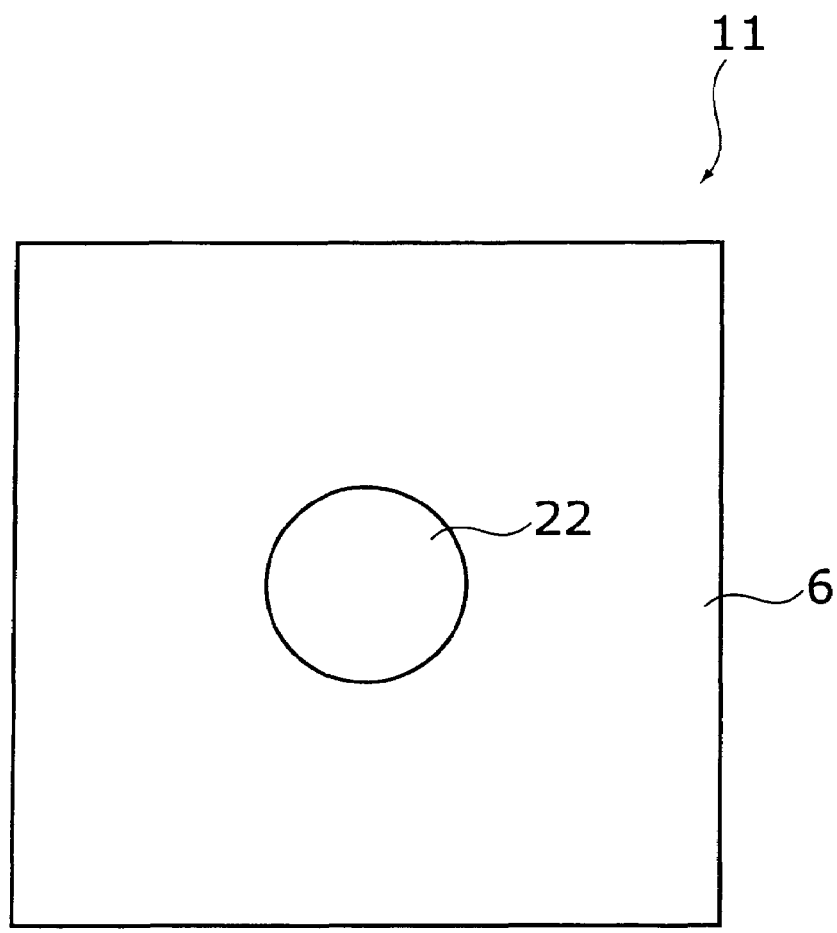
FIG. 2 is a schematic view illustrating the top surface structure of the relevant part of the semiconductor light emitting device.

FIG. 2 is a schematic view illustrating the top surface structure of the relevant part of the semiconductor light emitting device 11.

The semiconductor light emitting device 11 according to this embodiment has a structure in which a reflecting layer 25, a contact layer 12, and a semiconductor layer 6 including a light emitting layer 8 are laminated on a substrate 16. The first major surface (upper surface) of the semiconductor layer 6 is a light extraction surface, on which a first electrode 22 is provided via a contact layer 4. A second electrode 20 is provided on the backside of the substrate 16.

Figure 3:
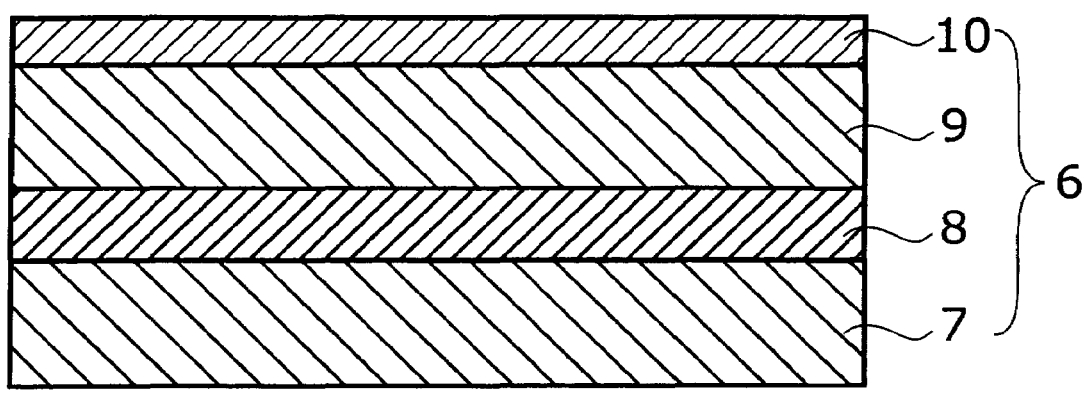
FIG. 3 is a schematic view illustrating the cross-sectional structure of a semiconductor layer including a light emitting layer.

As shown in FIG. 3, the semiconductor layer 6 is a semiconductor laminated body including, for example, a cladding layer 7, a light emitting layer (active layer). 8, a cladding layer 9, and a current diffusion layer 10. The cladding layer 7, the light emitting layer 8, the cladding layer 9, and the current diffusion layer 10 are laminated in this order on the contact layer 12. The light emitting layer 8 is sandwiched between the cladding layers 7 and 9 having a larger bandgap than the light emitting layer 8. One of the cladding layers 7 and 9 is made of a semiconductor of a first conductivity type, and the other is of a second conductivity type.

In this embodiment, for example, the cladding layer 7 is made of p-type InAlP or InGaAlP, and the cladding layer 9 is made of n-type InAlP or InGaAlP. The light emitting layer 8 illustratively has a multiple quantum well structure of InGaP/InGaAlP. The current diffusion layer 10 is illustratively made of n-type GaAs.

Alternatively, it is also possible to make the cladding layer 7 from p-type AlGaN, the light emitting layer 8 from a multiple quantum well structure of AlGaN/AlInGaN, the cladding layer 9 from n-type AlGaN, and the current diffusion layer 10 from n-type GaN.

Naturally, the materials of the layers are not limited to the foregoing, but the layers may be made of other semiconductor materials. Furthermore, the semiconductor layer 6 is not limited to the above configuration. For example, the current diffusion layer 10 may be omitted.

If the semiconductor layer 6 is in direct contact with the reflecting layer 25 made of metal, good ohmic contact cannot be obtained. Hence the contact layer 12 is provided between the semiconductor layer 6 and the reflecting layer 25 for the purpose of reducing resistance therebetween. That is, the contact layer 12 is in contact with the second major surface of the semiconductor layer 6, which surface is located on the opposite side of the first major surface (light extraction surface) thereof. The contact layer 12 is desirably made of a semiconductor having a smaller bandgap than the semiconductor constituting the second major surface of the semiconductor layer 6. For example, when the cladding layer 7 is p-type InAlP or InGaAlP, the contact layer 12 is illustratively made of p-type GaAs or p-type GaP. Alternatively, when the cladding layer 7 is p-type AlGaN, the contact layer 12 is illustratively made of p-type GaN.

Furthermore, the contact layer 12 has a roughened surface on the opposite side of the surface in contact with the second major surface of the semiconductor layer 6. This roughening is provided on the interface between the contact layer 12 and the reflecting layer 25 at least in the portion opposed to the first electrode 22. This roughening is conducted illustratively by wet etching or dry etching the surface of the contact layer 12 to be roughened.

The roughened surface may have irregularities made of, for example, a plurality of cylinders, polygonal tubes, pyramids, cones, terraces, mesas or any combination of these elements. The size of the irregularities may be in a range of 10-1000 nanometers in height and in a range of 10-1000 nanometers in pitch.

Figure 4:
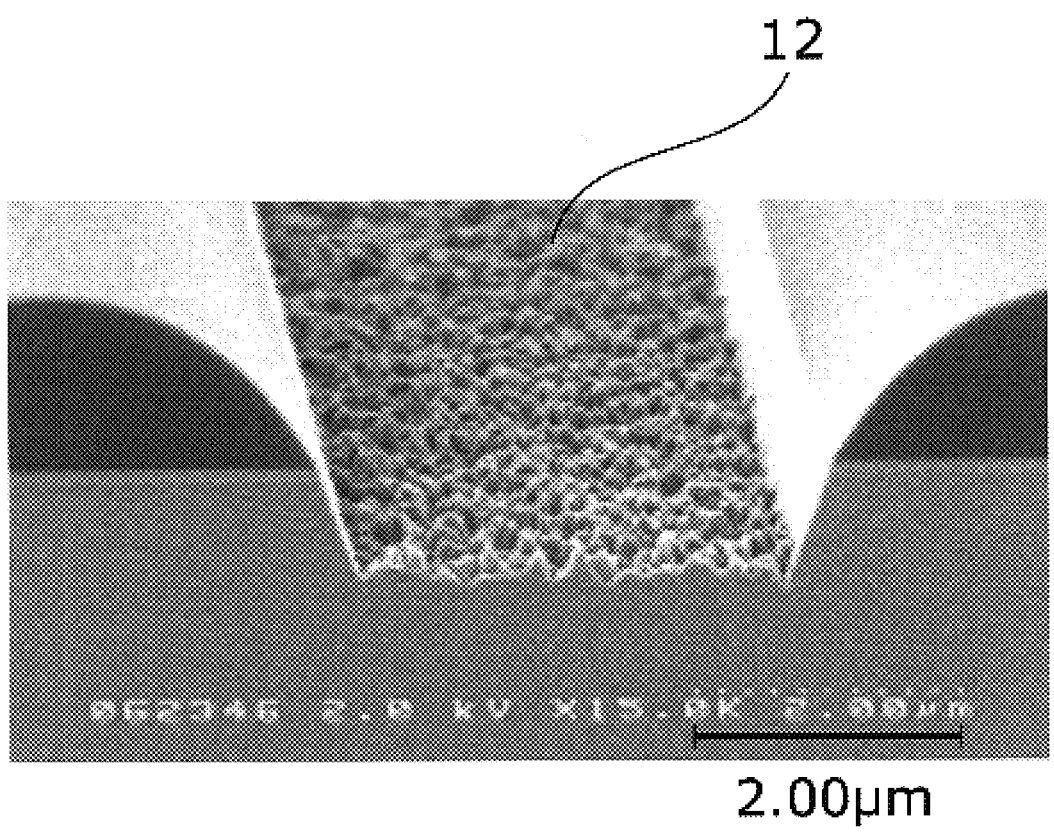
FIG. 4 is an electron micrograph of a roughened GaAs layer surface.

FIG. 4 is an electron micrograph of a roughened portion obtained by dry etching the surface of the contact layer 12 illustratively made of GaAs under the condition described later. As shown in FIG. 4, the irregularities of a size of tens to hundreds nanometers in height and in pitch are formed on the roughened surface.

A first metal layer 14 is formed on the roughened surface of the contact layer 12. The first metal layer 14 is formed so as to cover the irregularities of the roughened portion. Thus irregularities (undulations) are formed at the interface between the contact layer 12 and the first metal layer 14. The first metal layer 14 is illustratively made of an Au-containing metal material (including alloy) and formed by sputtering or vacuum evaporation. As the Au-containing metal material, alloys including Au and at least one of Ge, Zn, Mo, Pt, Ti and Ni can be used. A layered structure having a plurality of alloy layers (or metal layers) can also be used as the first metal layer 14.

Figure 5:
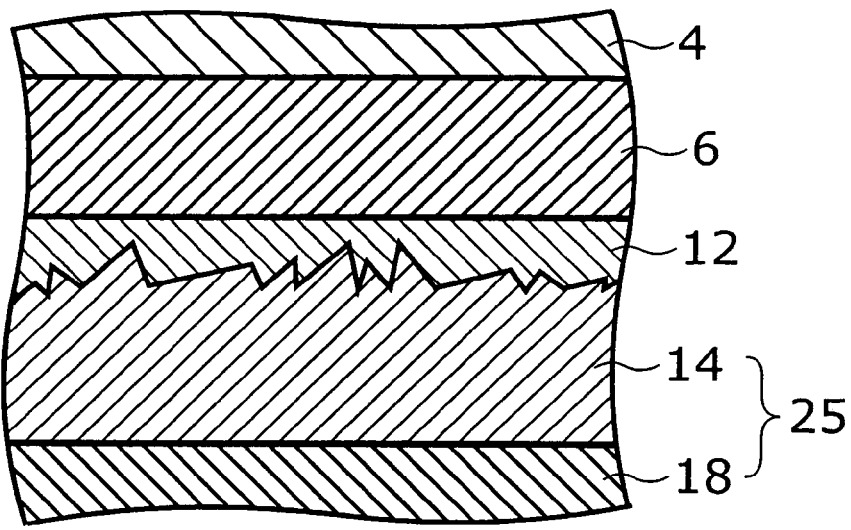
FIG. 5 is an enlarged cross-sectional view which schematically illustrates an indented interface between the contact layer and the reflecting layer, where the contact layer is left throughout the second major surface of the semiconductor layer.
Figure 6:
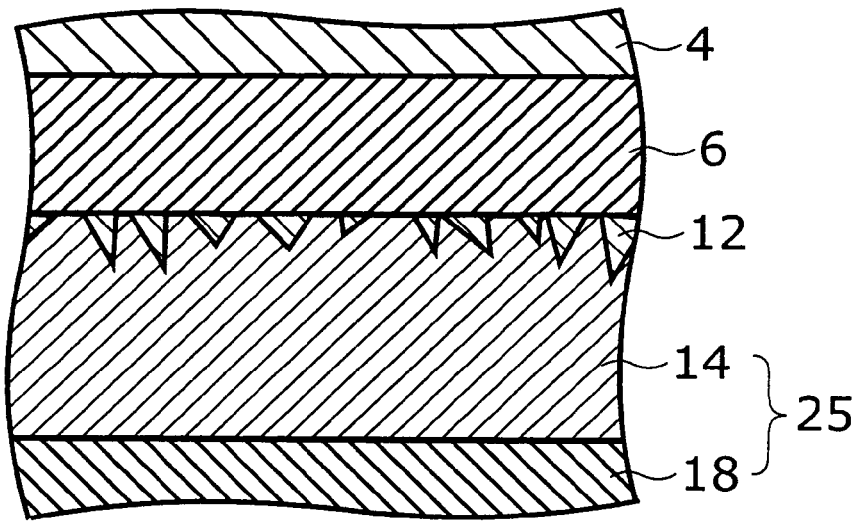
FIG. 6 is a schematic view similar to FIG. 5, where the contact layer is left partially and part of the reflecting layer does not extend into the semiconductor layer.
Figure 7:
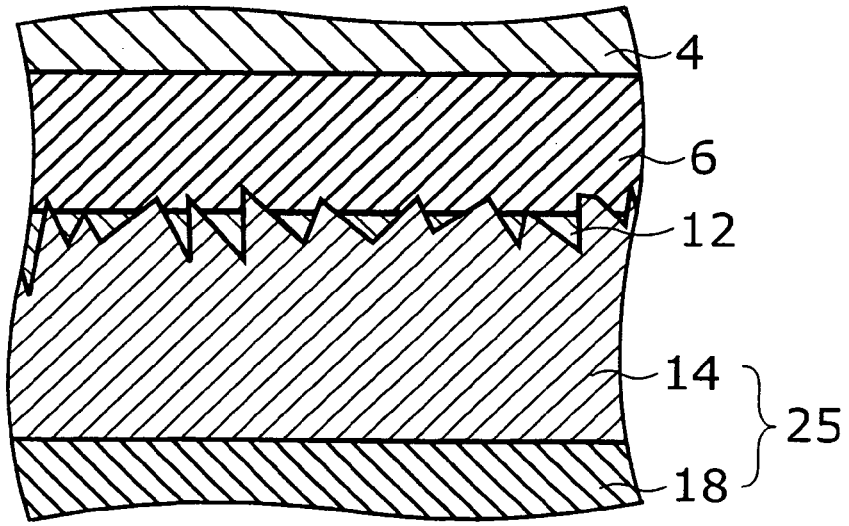
FIG. 7 is a schematic view similar to FIG. 5, where the contact layer is left partially and part of the reflecting layer extends into the semiconductor layer.

FIGS. 5 to 7 are enlarged cross-sectional views which schematically illustrate part of the interface between the contact layer 12 and the first metal layer 14. These figures show three situations with different degrees of roughening for the contact layer 12, respectively.

In FIG. 5, the etching depth from the surface side of the contact layer 12 does not reach the semiconductor layer 6, and the contact layer 12 is left throughout the second major surface of the semiconductor layer 6.

In FIG. 6, by the above-mentioned etching, part of the contact layer 12 is removed throughout its thickness. The contact layer 12 is left on the second major surface of the semiconductor layer 6 in an island configuration. The second major surface of the semiconductor layer 6 is not etched, and hence the first metal layer 14 does not extend into the semiconductor layer 6.

In FIG. 7, the contact layer 12 is left partially (in an island configuration) as with FIG. 6. Furthermore, the second major surface of the semiconductor layer 6 is partially etched, and the first metal layer 14 partially extends into the semiconductor layer 6.

In any of the above three situations, irregularities are formed at the interface between the contact layer 12 and the first metal layer 14. The above three situations may be mixed in one configuration.

The surface of the first metal layer 14 located on the opposite side of the interface with the contact layer 12 is bonded to a second metal layer 18. The second metal layer 18 is illustratively made of an Au-containing metal material (including alloy). As the Au-containing metal material, alloys including Au and at least one of Ge, Zn, Mo, Pt, Ti and Ni can be used. A layered structure having a plurality of alloy layers (or metal layers) can also be used as the first metal layer 14. As described later, the second metal layer 18 supported on the substrate 16 is pressed to the first metal layer 14 and heated together. Thus the first and second metal layers 14, 18 are bonded by solid-state diffusion bonding. This integrated combination of the first metal layer 14 and the second metal layer 18 constitutes a reflecting layer 25. The reflecting layer 25 is reflective of light emitted from the light emitting layer 8.

The first major surface (upper surface) of the semiconductor layer 6 is a light extraction surface to the outside of the device. A first electrode 22 is provided generally at the center of this surface via a contact layer 4. The first electrode 22 is a bonding pad to which a wire for connection to the external circuit (not shown) is connected. The planar configuration of the contact layer 4 and the first electrode 22 are illustratively circular as shown in FIG. 2, but is not limited thereto and may be rectangular or other configuration.

The first electrode 22 is made of metal (including alloy). The contact layer 4 serves to reduce resistance between the first electrode 22 and the semiconductor layer 6. For example, when the semiconductor layer 6 is made of an InGaAlP-based material, the contact layer 4 can be made of GaAs. A second electrode 20 made of metal (including alloy) is provided throughout the backside of the substrate 16.

The substrate 16 is conductive in order to ensure conduction between the two electrodes 22 and 20. In this embodiment, for example, the substrate 16 is a silicon substrate, which is inexpensive and easy to process. The substrate 16 may be omitted if the laminated body including the semiconductor layer 6, the contact layer 12, and the reflecting layer 25 has sufficient mechanical strength.

The semiconductor light emitting device 11 configured as above, except the first electrode 22 and the contact layer 4, illustratively has a thickness (height) of about 100 to 300 micrometers. The semiconductor light emitting device 11 illustratively has a lateral dimension of about 200 to 300 micrometers. The first electrode 22 and the contact layer 4 illustratively have a diameter of about 50 to 100 micrometers.

In the semiconductor light emitting device 11, when a current is injected via the two electrodes 22 and 20 into the light emitting layer 8, electrons and holes are recombined to emit light from the light emitting layer 8. The light emitted from the light emitting layer 8 toward the light extraction surface (first major surface) of the semiconductor layer 6 is extracted from the light extraction surface of the semiconductor layer 6 to the outside of the device. The light emitted from the light emitting layer 8 toward the surface (second major surface) located on the opposite side of the light extraction surface is transmitted through the contact layer 12 transparent to this light and then reflected at the interface between the contact layer 12 and the reflecting layer 25 (first metal layer 14). The reflected light is transmitted through the contact layer 12 and the semiconductor layer 6 and extracted from the light extraction surface of the semiconductor layer 6 to the outside of the device.

Furthermore, in this embodiment, the contact layer 12 is roughened to form irregularities at the interface between the reflecting layer 25 (first metal layer 14) and the contact layer 12, the interface being the surface of the reflecting layer 25 located on the second major surface side of the semiconductor layer 6. Therefore the light emitted from the light emitting layer 8 to the second major surface side is scattered and reflected (diffused) at the interface between the contact layer 12 and the reflecting layer 25. More specifically, the light reflected at the above-mentioned interface has various directions of travel, thereby decreasing the proportion of optical paths that repeat total reflection in the device. This can increase the amount of light transmitting the light extraction surface after being reflected at the above-mentioned interface. Furthermore, for example, the light emitted downward (toward the substrate 16) from the portion of the light emitting layer 8 located below the electrode 22 can be scattered laterally or obliquely by the irregularities of the interface between the contact layer 12 and the reflecting layer 25, thereby decreasing the proportion of reflections toward the electrode 22 that blocks light. This can also increase the proportion of light extracted outside. As a result, the light extraction efficiency to the outside of the device can be improved, and the semiconductor light emitting device 11 can achieve higher brightness.

Figure 8:
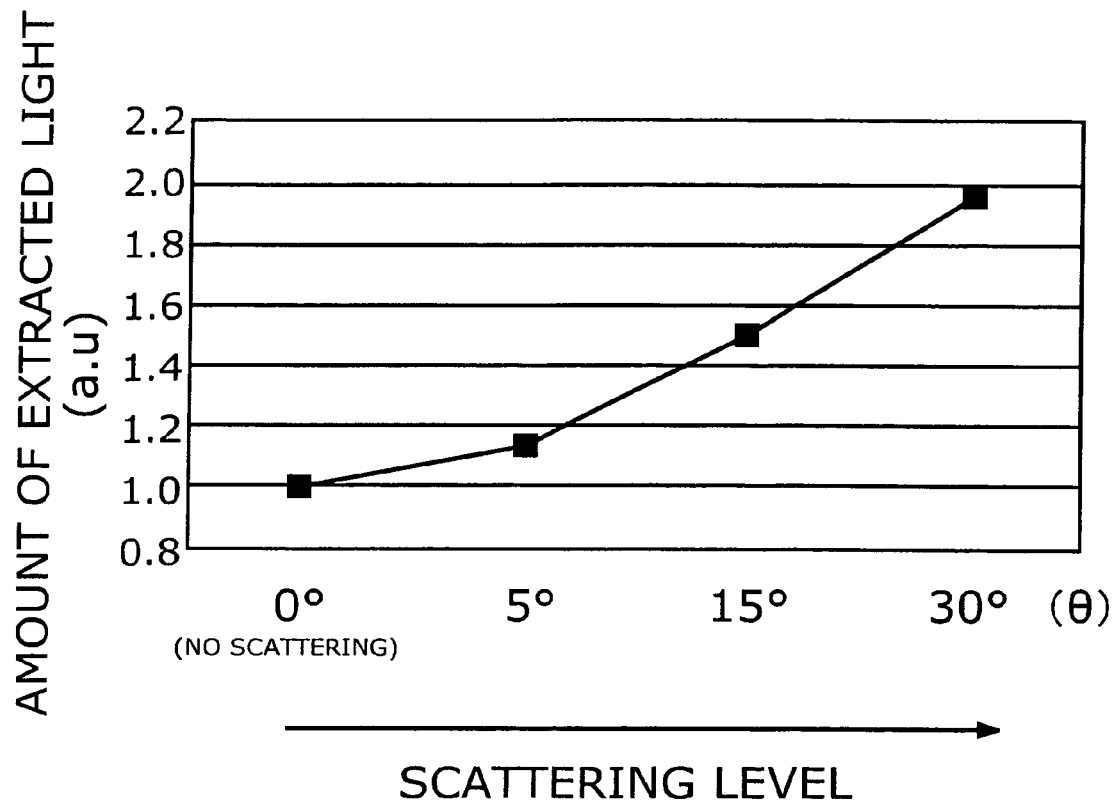
FIG. 8 is a graph showing the relationship of light scattering at the interface between the contact layer and the reflecting layer versus the amount of light extracted outside the device.

FIG. 8 is a graph showing the relationship of light scattering at the above-mentioned interface versus the amount of light extracted outside the device.

The vertical axis represents the amount of light extracted outside the device. It is represented in an arbitrary unit, with reference to the amount of extracted light (1.0) reflected at the above-mentioned interface without scattering. The amount of extracted light relative to this reference is plotted.

The horizontal axis represents the level of light scattering at the above-mentioned interface. This is described with reference to FIG. 9.

Figure 9:
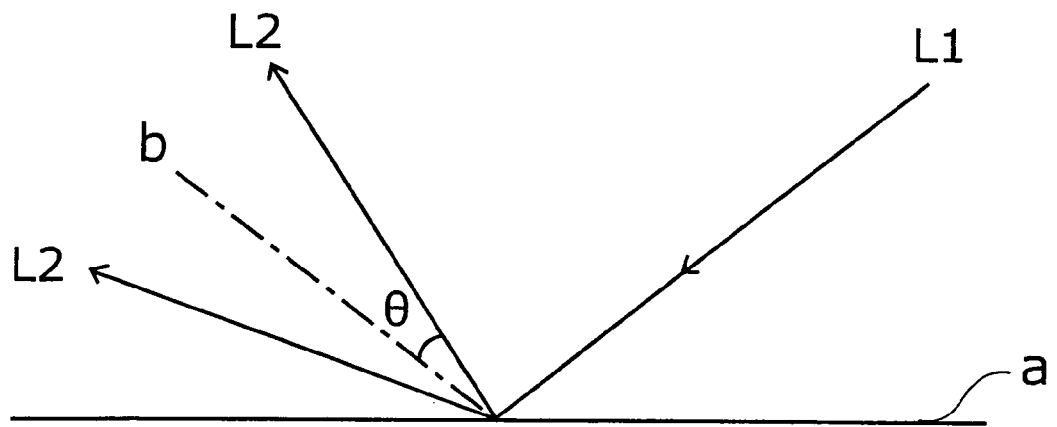
FIG. 9 is a schematic view for explaining the angle on the horizontal axis in the graph of FIG. 8.

FIG. 9 schematically shows incident light L1 reflected at the interface (a) between the contact layer and the reflecting layer as reflected light (scattered light) L2. The angle $\theta$ is the spreading angle of the scattered light L2 measured from the central axis (b) of the spread of the scattered light L2. This angle is represented on the horizontal axis in the graph of FIG. 8. The optical intensity of the scattered light L2 has a Gaussian distribution having a peak at the central axis (b).

As seen from the result of FIG. 8, the amount of extracted light is larger when scattering reflection occurs at the above-mentioned interface than when no scattering reflection occurs (θ=0°). As the level of scattering increases (as the angle θ increases), the amount of extracted light increases.

Next, an example method of manufacturing a semiconductor light emitting device 11 according to this embodiment is described.

FIGS. 10 to 15 are process cross sections illustrating the relevant part of a process of manufacturing the semiconductor light emitting device 11.

Figure 10:
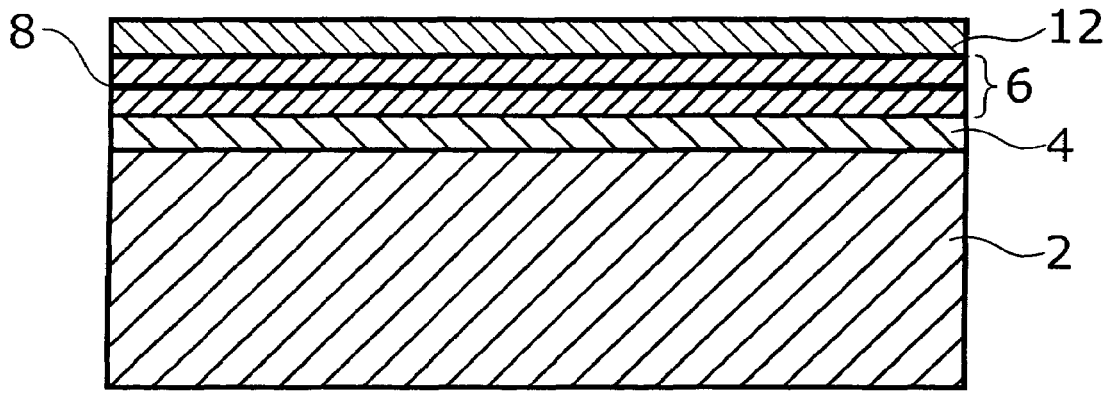
FIGS. 10 to 15 are process cross sections illustrating the relevant part of a process of manufacturing a semiconductor light emitting device according to the first embodiment of the invention.

First, as shown in FIG. 10, a contact layer 4, a semiconductor layer 6, and a contact layer 12 are epitaxially grown successively on a first substrate 2. The first substrate 2 used herein is suitable for good epitaxial growth of these layers, and can be illustratively made of GaAs for an InGaAlP-based light emitting device. For a GaN-based light emitting device, the first substrate 2 can be illustratively made of sapphire or SiC.

Figure 11:
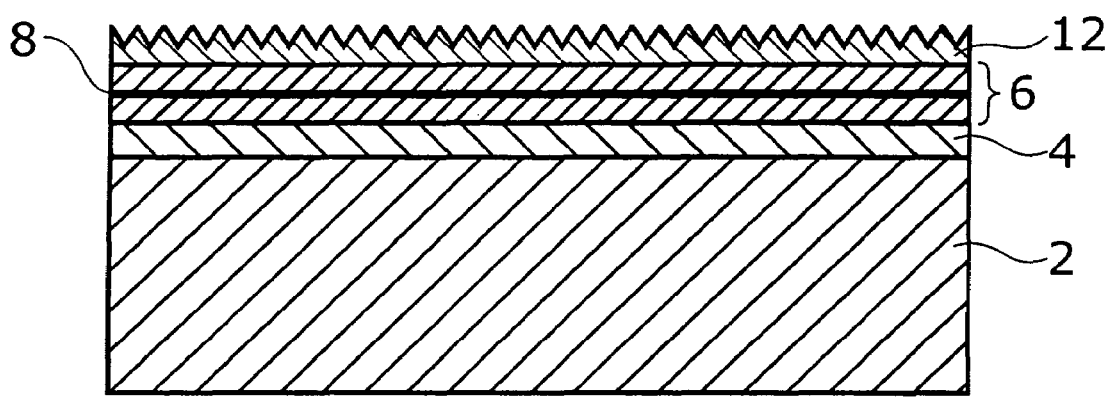

Next, for example, the surface of the contact layer 12 made of GaAs is roughened by RIE (Reactive Ion Etching) (FIG. 11). An example of the etching condition is as follows:
Etching gas: $BCl_3$
Applied RF power: 300 [W]
Pressure of atmosphere: 66.7 [mPa]
Temperature: room temperature (ordinary temperature)
Etching time: 10 minutes The electron micrograph of FIG. 4 described above shows a roughened surface of the contact layer 12 made of GaAs, which is obtained by etching under this condition.

In the case of an InGaAlP-based light emitting device, for example, a contact layer 12 of GaAs can be used to achieve good ohmic contact with the semiconductor layer 6 and the reflecting layer 25. Here, as a method of roughening the contact layer 12 of GaAs to form irregularities as illustrated in FIGS. 5 to 7, an indium (In) doped layer can be laminated thereon and then etched.

For example, in the step shown in FIG. 10, an InGaAlP layer can be illustratively grown about 100 nanometers on the contact layer (GaAs layer) 12 and then etched under the condition described above. Thus roughening with irregularities as illustrated in FIGS. 5 to 7 can be achieved more reliably. This is presumably because of concentration modulation or segregation of indium during etching, which allows portions with high indium concentration to act as a fine mask for the underlying GaAs layer.

Figure 12:
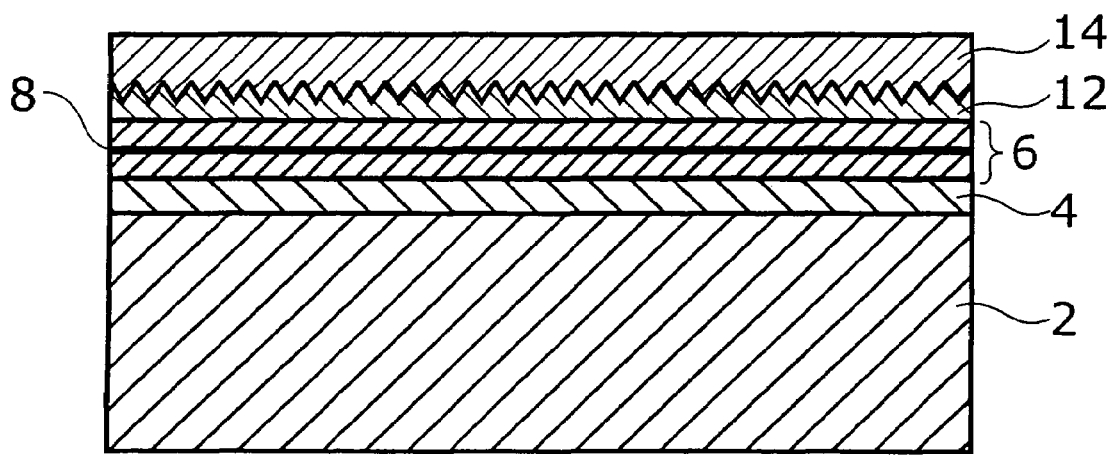

After the contact layer 12 is roughened, as shown in FIG. 12, a first metal layer 14 is formed so as to cover the roughened surface of the contact layer 12. The first metal layer 14 is illustratively made of an Au-containing metal material (including alloy) and formed by sputtering or vacuum evaporation. The first metal layer 14 illustratively has a thickness of about 1 micrometer. The interface between the contact layer 12 and the first metal layer 14 has irregularities, which reflect the roughened surface configuration of the contact layer 12.

Figure 13:
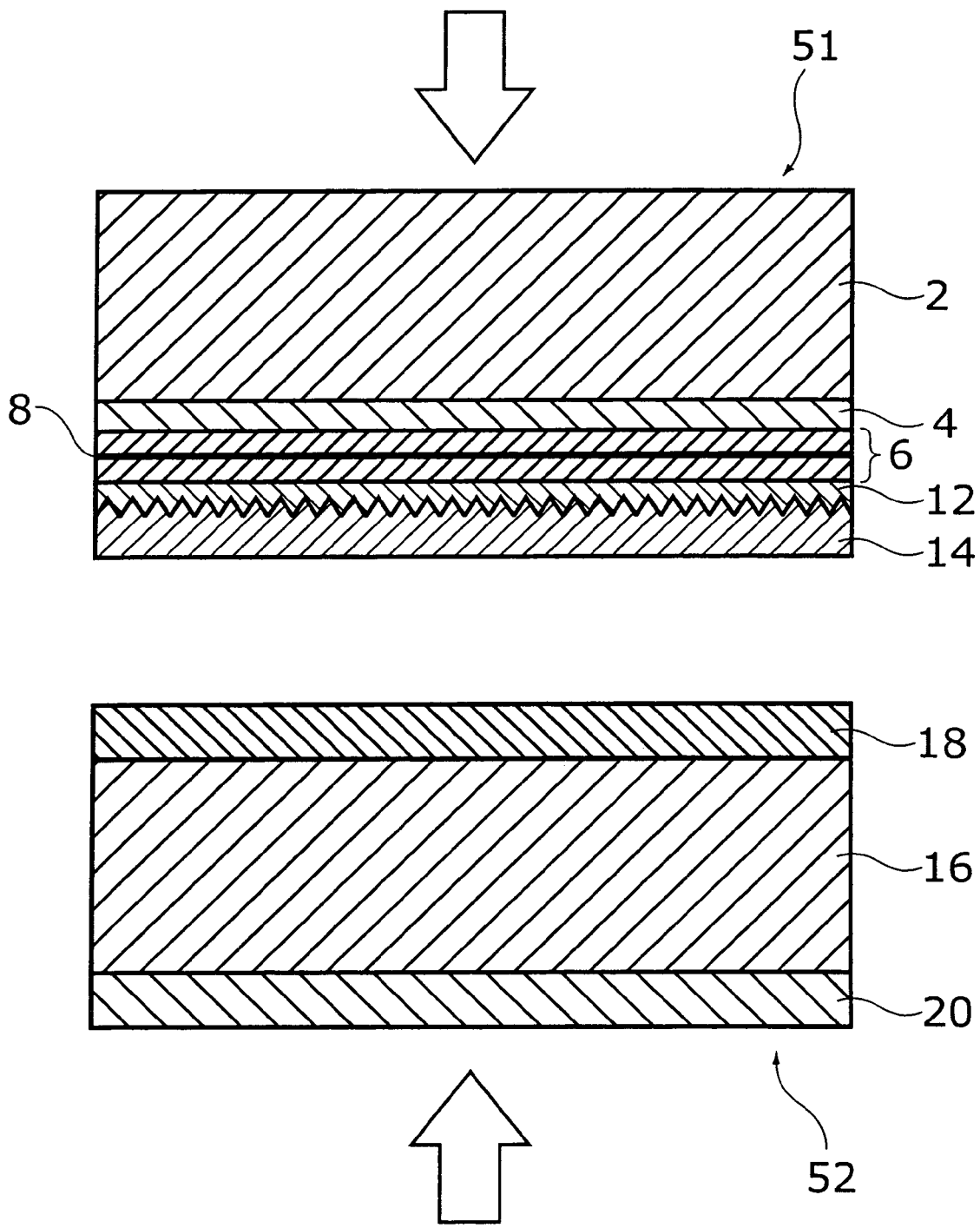

Next, as shown in FIG. 13, the first laminated body 51 obtained up to the last step is bonded by thermocompression to a second laminated body 52 in which a second metal layer 18 and a second electrode 20 are formed, respectively, on both sides of a second substrate 16. The second metal layer 18 is illustratively made of an Au-containing metal material (including alloy) and formed by sputtering or vacuum evaporation. The second metal layer 18 illustratively has a thickness of about 1 micrometer.

The second electrode 20 is made of a metal material (including alloy). Alternatively, in this step, the second metal layer 18 is formed only on one side of the second substrate 16, and the second electrode 20 may be formed on the other side of the second substrate 16 after the two laminated bodies 51 and 52 are pressure bonded.

The first metal layer 14 and the second metal layer 18 are heated while being pressed to each other. Thus the metal layers 14 and 18 are bonded by solid-state diffusion bonding. For example, the heating temperature is about 400° C. and for a 2-inch wafer, a force of $9.80665 \times 10^2$ [N] or more is applied to the laminated bodies 51 and 52 in the thickness direction.

Figure 14:
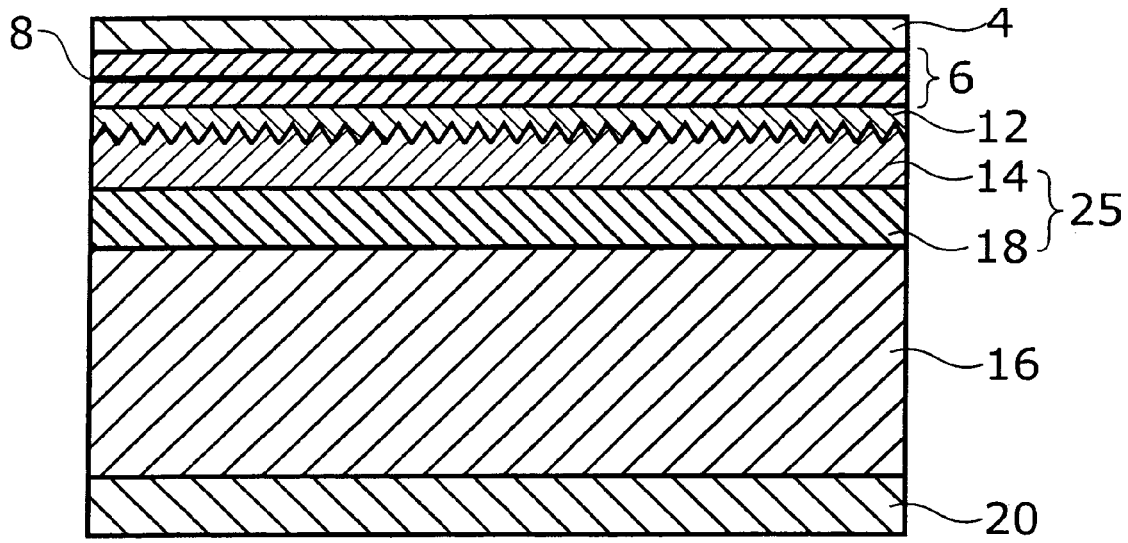

Next, as shown in FIG. 14, the first substrate 2, which was used for epitaxial growth of the semiconductor layer 6 and the like, is removed illustratively by etching. This results in a structure in which the reflecting layer 25, the contact layer 12, the semiconductor layer 6, and the contact layer 4 are laminated on the conductive substrate 16 illustratively made of silicon.

Figure 15:
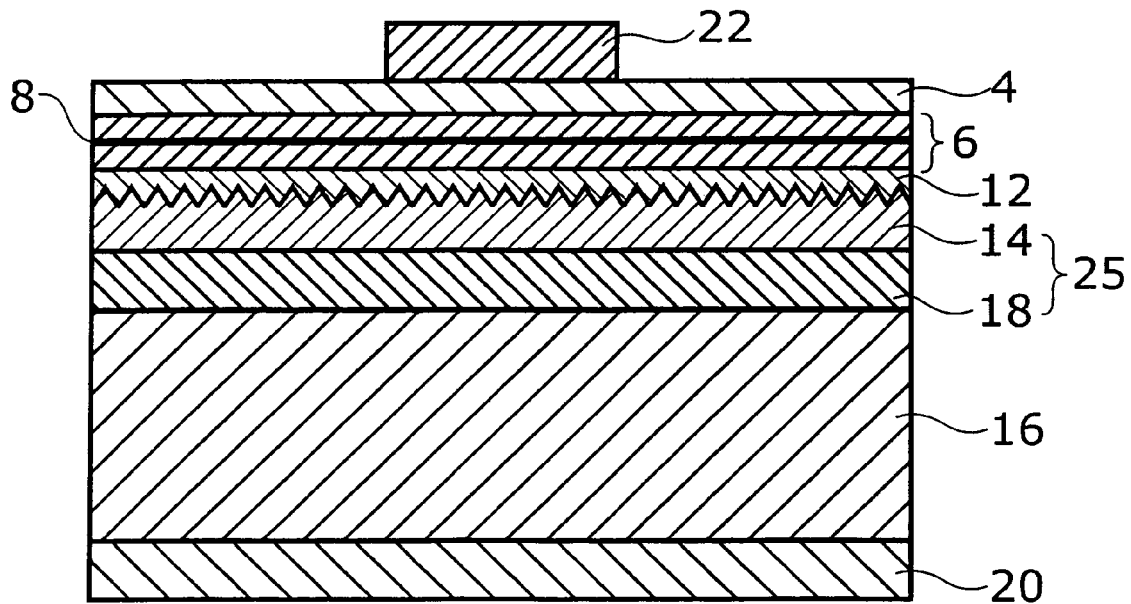

Next, as shown in FIG. 15, a first electrode (bonding pad) 22 is selectively formed generally at the center on the contact layer 4. The first electrode 22 is formed by sputtering or vacuum evaporation. Subsequently, the contact layer 4 outside the portion underlying the first electrode 22 is etched away. Thus a semiconductor light emitting device 11 shown in FIGS. 1 and 2 is obtained. The first substrate 2 may be removed before the step of pressure bonding shown in FIG. 13 if there is no problem concerning handling and the mechanical strength of the semiconductor layer 6 and the like.

SECOND EMBODIMENT

Next, a second embodiment of the invention is described. Elements similar to those in the first embodiment described above are marked with the same reference numerals and not described in detail.

Figure 16:
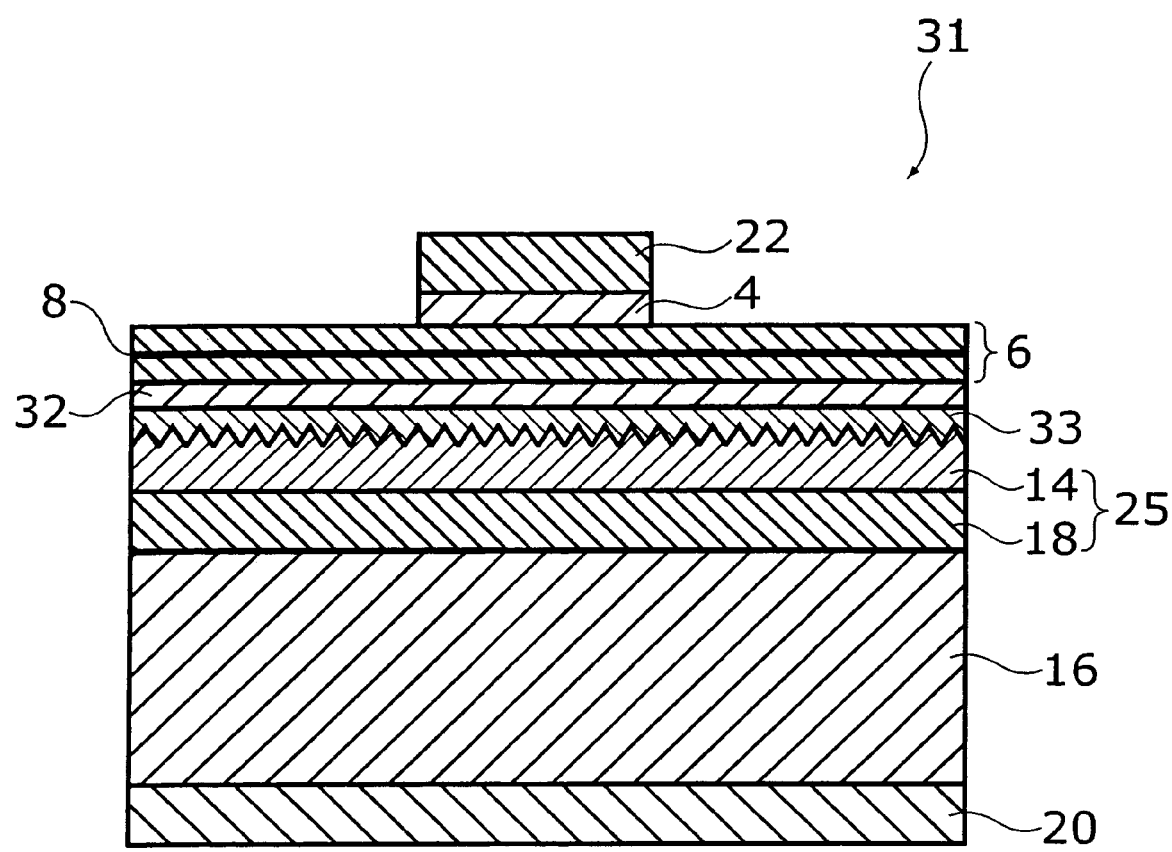
FIG. 16 is a schematic view illustrating the cross-sectional structure of the relevant part of a semiconductor light emitting device according to a second embodiment of the invention.

FIG. 16 is a schematic view illustrating the cross-sectional structure of the relevant part of a semiconductor light emitting device 31 according to the second embodiment of the invention.

The semiconductor light emitting device 31 according to this embodiment differs from the semiconductor light emitting device 11 according to the first embodiment described above in that a transparent electrode layer 33 is provided under the contact layer 32.

The contact layer 32 is in contact with the second major surface of the semiconductor layer 6, which surface is located on the opposite side of the first major surface (light extraction surface) thereof. The contact layer 32 is desirably made of a semiconductor having a smaller bandgap than the semiconductor constituting the second major surface (the major surface located on the opposite side of the first major surface) of the adjacent semiconductor layer 6. For example, when the cladding layer 7 is p-type InAlP or InGaAlP, the contact layer 32 can be illustratively made of p-type GaAs. Alternatively, when the cladding layer 7 is p-type AlGaN, the contact layer 32 can be illustratively made of p-type GaN.

The transparent electrode layer 33 is provided in contact with the contact layer 32. The transparent electrode layer 33 is conductive, and transparent to light emitted from the light emitting layer 8. For example, the transparent electrode layer 33 can be made of metal oxides such as ITO (Indium Tin Oxide), IZO (Indium Zinc Oxide), and zinc oxide, metal nitrides such as titanium nitride, and other metal compounds. The transparent electrode layer 33 has a roughened surface on the opposite side of the surface in contact with the contact layer 32. This roughening is conducted by entirely etching the surface of the transparent electrode layer 33 to be roughened.

A first metal layer 14 is formed on the roughened surface of the transparent electrode layer 33. The first metal layer 14 is formed so as to cover the irregularities of the roughened portion. Thus irregularities (undulations) are formed at the interface between the transparent electrode layer 33 and the first metal layer 14. The first metal layer 14 is illustratively made of an Au-containing metal material (including alloy) and formed by sputtering or vacuum evaporation.

As described above, in this embodiment again, irregularities are formed at the interface between the reflecting layer 25 (first metal layer 14) and the transparent electrode layer 33, the interface being the surface of the reflecting layer 25 located on the transparent electrode layer 33 side. Therefore the light emitted from the light emitting layer 8 to the second major surface side is scattered and reflected (diffused) at the interface between the transparent electrode layer 33 and the reflecting layer 25. More specifically, the light reflected at the above-mentioned interface has various directions of travel, thereby decreasing the proportion of optical paths that repeat total reflection in the device. This can increase the amount of light transmitting the light extraction surface after being reflected at the above-mentioned interface. Furthermore, for example, the light emitted downward (toward the substrate 16) from the portion of the light emitting layer 8 located below the electrode 22 can be scattered laterally or obliquely by the irregularities of the interface between the transparent electrode layer 33 and the reflecting layer 25, thereby decreasing the proportion of reflections toward the electrode 22 that blocks light. This can also increase the proportion of light extracted outside. As a result, the light extraction efficiency to the outside of the device can be improved, and the semiconductor light emitting device 31 can achieve higher brightness.

Furthermore, in this embodiment, the transparent electrode layer 33 placed under the contact layer 32. provides the following advantages.

The contact layer 32 is illustratively made of GaAs or other semiconductors for ensuring good ohmic contact with the semiconductor layer 6. Because GaAs is likely to absorb light emitted from the light emitting layer 8 illustratively based on InGaAlP, it is preferable that the contact layer 32 be thinner. However, as the contact layer 32 becomes thinner, the contact layer 32 is likely to be excessively etched, which will increase the forward voltage of the device.

In this regard, in this embodiment, the contact layer 32 is not etched. Thus, even if the contact layer 32 is thinly formed, its excessive removal that may increase the forward voltage will not occur. By making the contact layer 32 thinner, optical absorption in the contact layer 32 can be reduced.

For example, in the semiconductor light emitting device 11 according to the first embodiment, the contact layer 12 made of GaAs or the like has a thickness of about 50 nanometers. However, the above-mentioned contact layer 32 similarly made of GaAs or the like can be thinned to a thickness of about 20 nanometers.

The transparent electrode layer 33 to be etched can be formed relatively thick because it is made of ITO or the like having a higher optical transmittance than GaAs or other translucent semiconductors. For example, the transparent electrode layer 33 is 100 to 500 nanometers thick. Furthermore, because ITO forms no alloy layers with the contact layer 32 and the first metal layer 14, the decrease of optical transmittance due to such alloy layers can be prevented.

Next, an example method of manufacturing a semiconductor light emitting device 31 according to this embodiment is described.

FIGS. 17 to 22 are process cross sections illustrating the relevant part of a process of manufacturing the semiconductor light emitting device 31.

Figure 17:
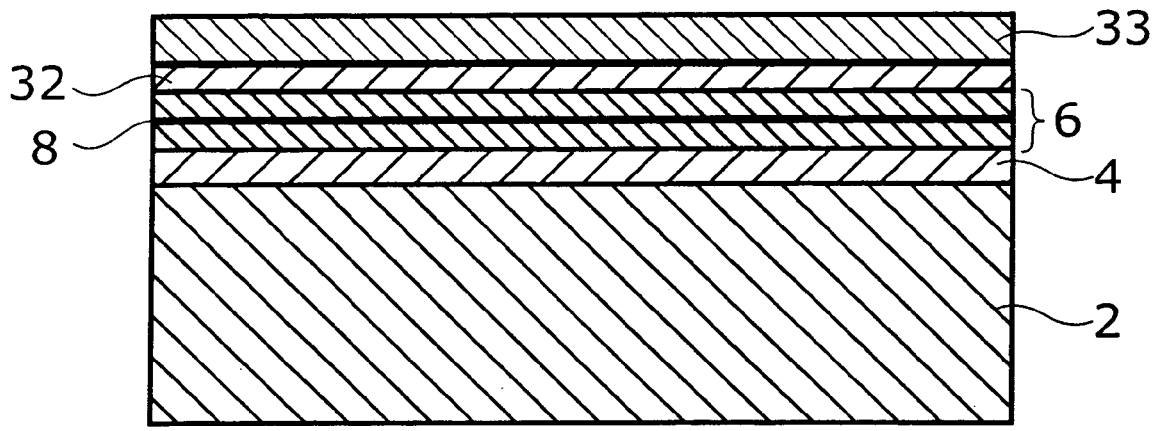
FIGS. 17 to 22 are process cross sections illustrating the relevant part of a process of manufacturing a semiconductor light emitting device according to the second embodiment of the invention.

First, as shown in FIG. 17, a contact layer 4, a semiconductor layer 6 including a light emitting layer 8, and a contact layer 32 are epitaxially grown successively on a first substrate 2.

Next, on the contact layer 32, a layer illustratively made of ITO (Indium Tin Oxide) is formed as a transparent electrode layer 33. The transparent electrode layer 33 made of ITO is formed illustratively by direct-current sputtering. During this sputtering process, the workpiece on which the film is grown (the laminated body composed of the first substrate 2, the contact layer 4, the semiconductor layer 6, and the contact layer 32) is heated to 250 [° C.]. The DC power is set to 200 [W] (discharge voltage 250 [V], discharge current 0.82 [A]).

Under the above condition, a transparent electrode layer 33 made of ITO is obtained, which has a film. thickness of 200 nanometers, a specific resistance of $1.6 \times 10^{-4}$ [Ωcm], and a transmittance of 95% or more to the light emitted from the light emitting layer 8.

Figure 18:
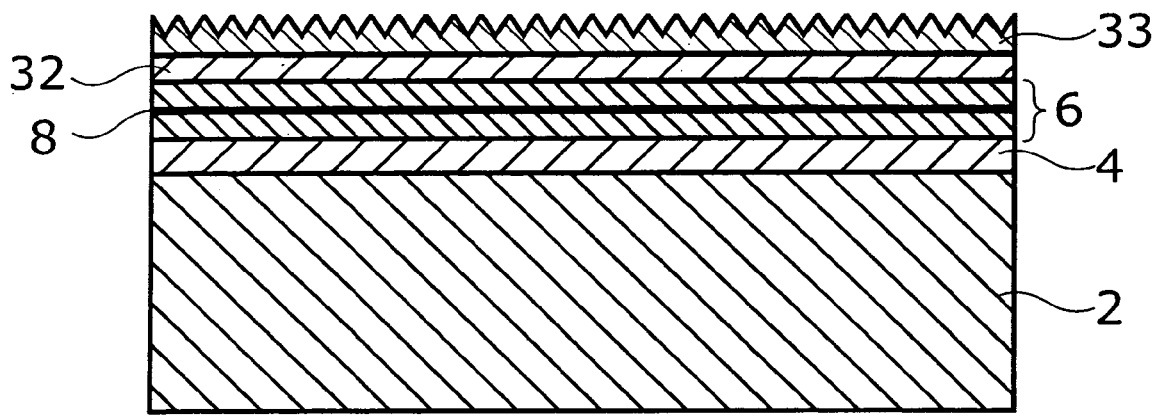

Next, the surface of the transparent electrode layer 33 is roughened by wet etching (FIG. 18). For example, as an etching liquid, a mixture of 35% concentrated hydrochloric acid and water at a ratio of 1:1 is used. The temperature is 45 [° C.], and the etching time is 2 minutes.

Figure 19:
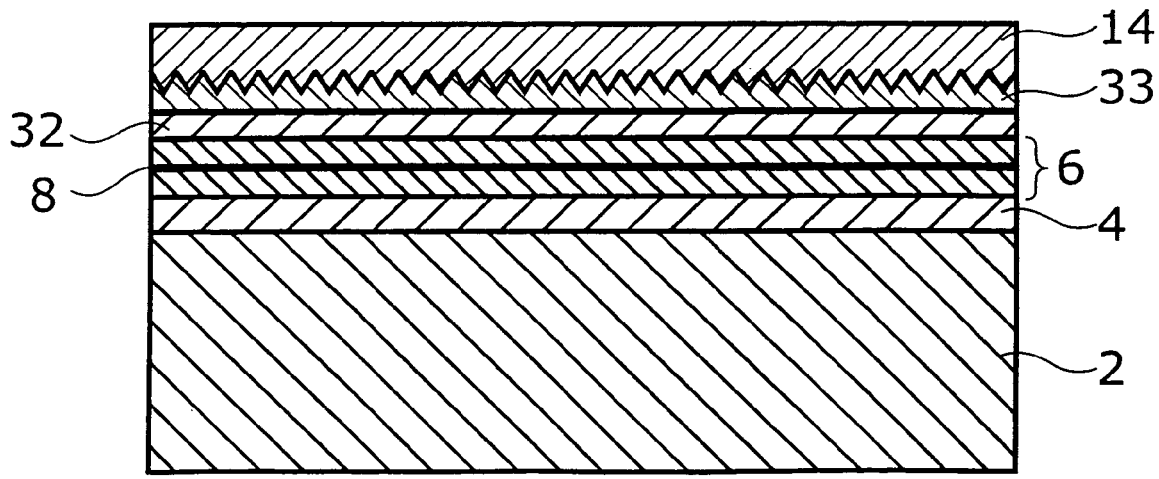

After the transparent electrode layer 33 is roughened, as shown in FIG. 19, a first metal layer 14 is formed so as to cover the roughened surface of the transparent electrode layer 33. The first metal layer 14 is illustratively made of an Au-containing metal material (including alloy) and formed by sputtering or vacuum evaporation. The interface between the transparent electrode layer 33 and the first metal layer 14 has irregularities, which reflect the roughened surface configuration of the transparent electrode layer 33.

Figure 20:
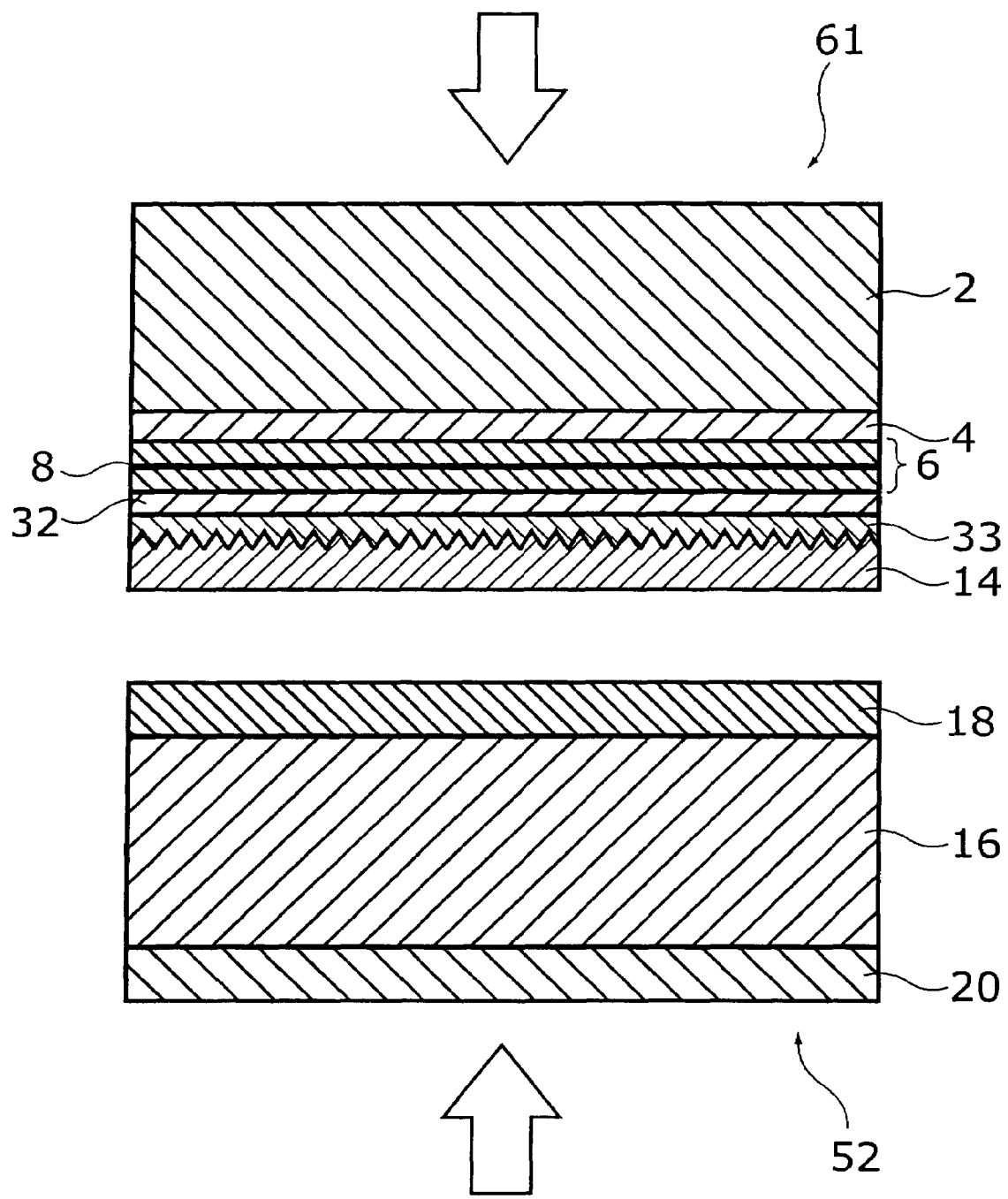

Next, as shown in FIG. 20, the first laminated body 61 obtained up to the last step is bonded by thermocompression to a second laminated body 52 in which a second metal layer 18 and a second electrode 20 are formed, respectively, on both sides of a second substrate 16. The second metal layer 18 is illustratively made of an Au-containing metal material (including alloy) and formed by sputtering or vacuum evaporation.

The second electrode 20 is made of a metal material (including alloy). Alternatively, in this step, the second metal layer 18 is formed only on one side of the second substrate 16, and the second electrode 20 may be formed on the other side of the second substrate 16 after the two laminated bodies 61 and 52 are pressure bonded.

The first metal layer 14 and the second metal layer 18 are heated while being pressed to each other. Thus the metal layers 14 and 18 are bonded by solid-state diffusion bonding. For example, the heating temperature is about 400° C., and for a 2-inch wafer, a force of $9.80665 \times 10^2$ [N] or more is applied to the laminated bodies 61 and 52 in the thickness direction.

Figure 21:
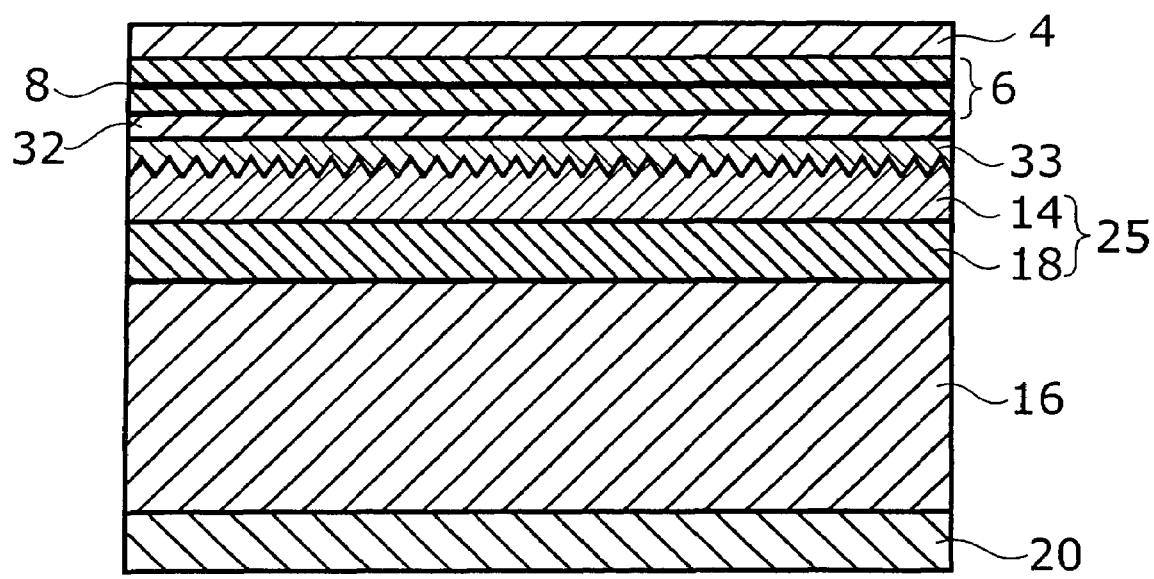

Next, as shown in FIG. 21, the first substrate 2, which was used for epitaxial growth of the semiconductor layer 6 and the like, is removed illustratively by etching. This results in a structure in which the reflecting layer 25, the transparent electrode layer 33, the contact layer 32, the semiconductor layer 6, and the contact layer 4 are laminated on the conductive substrate 16 illustratively made of silicon.

Figure 22:
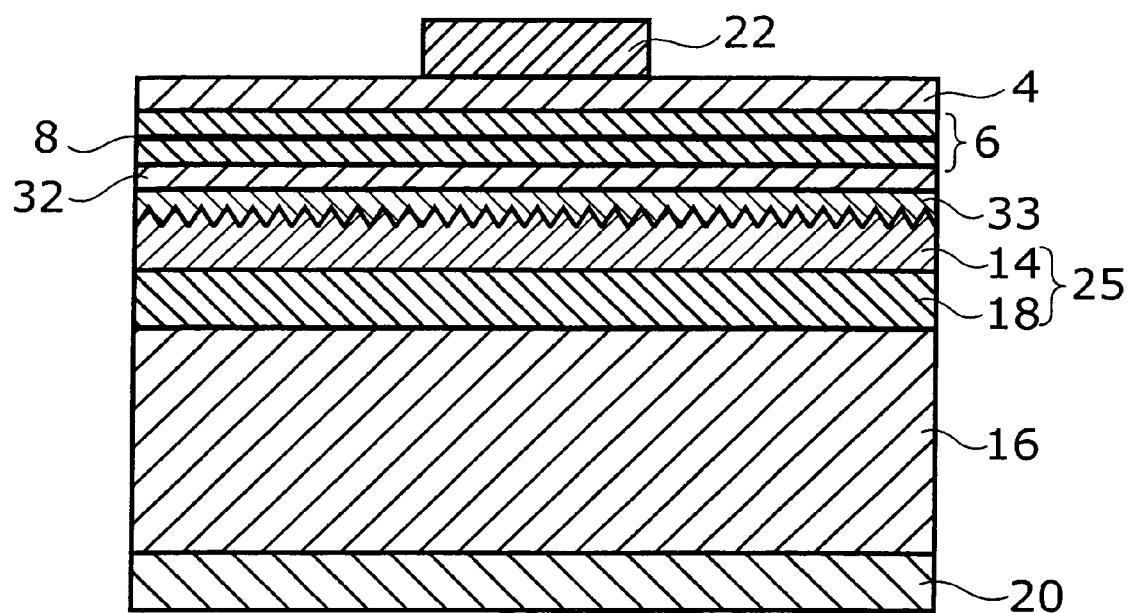

Next, as shown in FIG. 22, a first electrode (bonding pad) 22 is selectively formed generally at the center on the contact layer 4. The first electrode 22 is formed by sputtering or vacuum evaporation. Subsequently, the contact layer 4 outside the portion underlying the first electrode 22 is etched away. Thus a semiconductor light emitting device 31 shown in FIG. 16 is obtained. The first substrate 2 may be removed before the step of pressure bonding shown in FIG. 20 if there is no problem concerning handling and the mechanical strength of the semiconductor layer 6 and the like.

THIRD EMBODIMENT

Next, a third embodiment of the invention is described. Elements similar to those in the first and second embodiments described above are marked with the same reference numerals and not described in detail.

Figure 23:
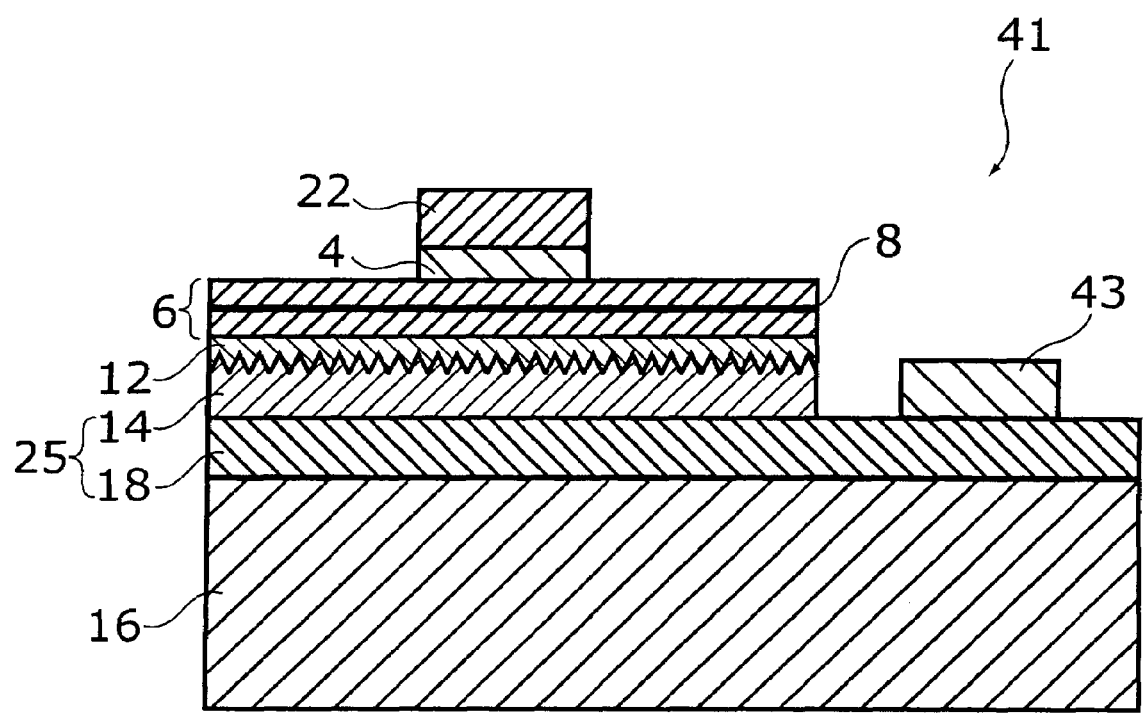
FIG. 23 is a schematic view illustrating the cross-sectional structure of the relevant part of a semiconductor light emitting device according to a third embodiment of the invention.

FIG. 23 is a schematic view illustrating the cross-sectional structure of the relevant part of a semiconductor light emitting device 41 according to the third embodiment of the invention.

The semiconductor light emitting device 41 according to the third embodiment has a second electrode 43 on the frontside of the substrate 16 rather than on the backside thereof. That is, the third embodiment is the same as the first and second embodiments in that the second metal layer 18 is formed throughout the surface of the substrate 16, but the first metal layer 14, the contact layer 12, and the semiconductor layer 6 laminated on the second metal layer 18 are provided not throughout the second metal layer 18. The second electrode 43 is provided on the second metal layer 18 beside the portion where the laminated body is provided. In this case, the substrate 16 may not be conductive.

FOURTH EMBODIMENT

Figure 27:
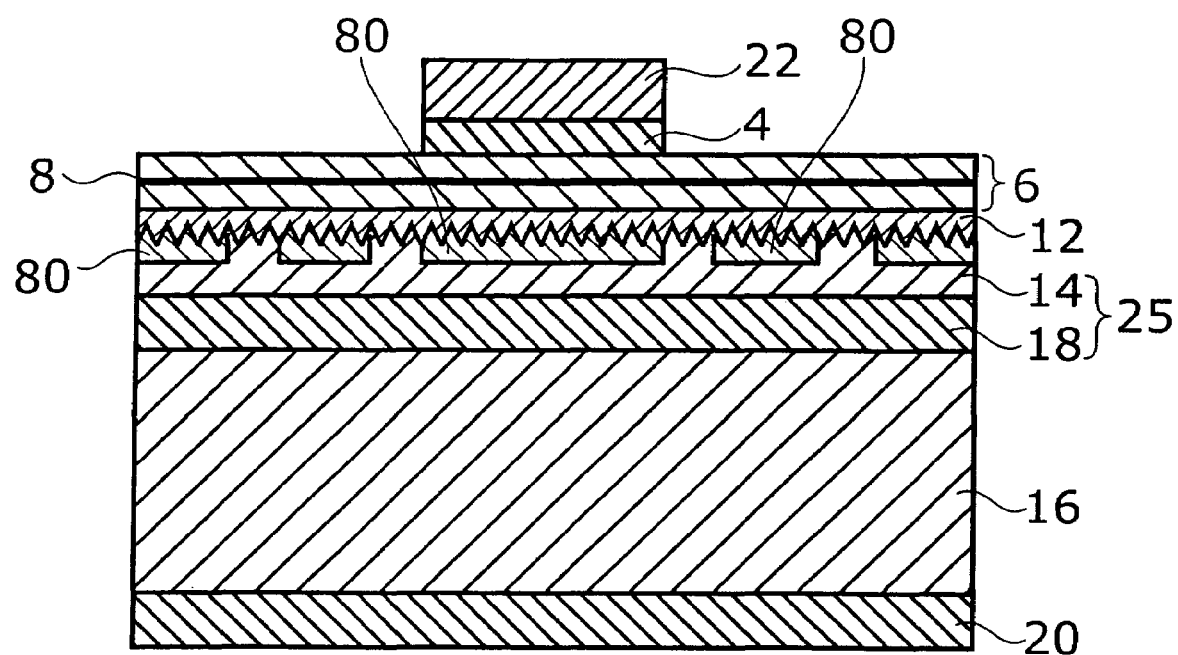
FIG. 27 is a schematic view illustrating the cross-sectional structure of the relevant part of a semiconductor light emitting device according to the fourth embodiment of the invention.

FIG. 27 is a schematic view illustrating the cross-sectional structure of the relevant part of a semiconductor light emitting device according to the fourth embodiment of the invention. Elements similar to those in the first, second and third embodiments described above are marked with the same reference numerals and not described in detail.

In this embodiment, an insulating film 80 is selectively provided between the contact layer 12 and the first metal layer 14. The insulating film 80 is formed throughout the roughened surface of the contact layer 12. Subsequently, the insulating film 80 is selectively removed. The first metal layer 14 is formed on the roughened surface of the contact layer 12 so as to cover the insulating film 80.

The contact layer 12, for example, is made of GaAs or GaR The insulating film 80 is made of material whose refractive index is lower than that of the contact layer 12. The insulating film 80, for example, is made of silicon oxide, silicon nitride or silicon oxynitride. The transparent electrode layer 33 described with reference to the second embodiment may be provided between the contact layer 12 and the insulating film 80.

The reflectance of the light emitted from the light emitting layer 8 toward the contact layer 12 side, at the interface between the contact layer 12 and the insulating film 80, can be high. With a combination of the reflection at the insulating film 80 and the diffuse reflection at the roughened surface, the efficiency of the light extraction to the outside of the device is more improved.

Figure 28:
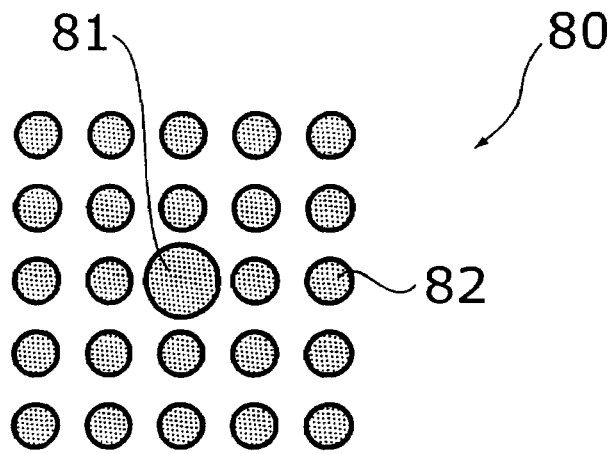
FIG. 28 is a schematic view illustrating an example of the planar pattern of the insulating film of the semiconductor light emitting device according to the fourth embodiment of the invention.

FIG. 28 is a schematic view illustrating an example of the planar pattern of the insulating film 80.

In this embodiment, a circular insulating film 81 is provided on a portion opposed to the first electrode 22. Plural circular insulating films 82 are provided around the insulating film 81.

Figure 29:
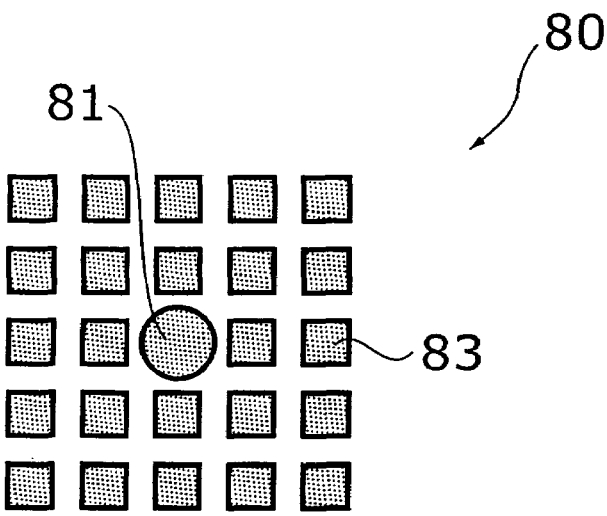
FIG. 29 is a schematic view illustrating another example of the planar pattern of the insulating film of the semiconductor light emitting device according to the fourth embodiment of the invention.

FIG. 29 is a schematic view illustrating another example of the planar pattern of the insulating film 80.

In this embodiment, a circular insulating film 81 is provided on a portion opposed to the first electrode 22. Plural quadrangular insulating films 83 are provided around the insulating film 81.

Figure 30:
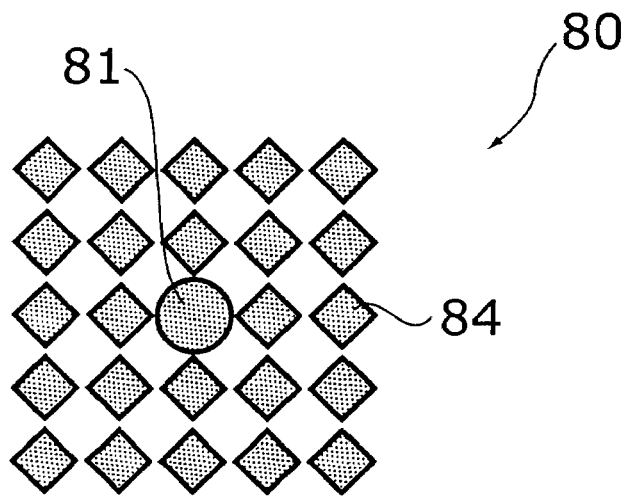
FIG. 30 is a schematic view illustrating another example of the planar pattern of the insulating film of the semiconductor light emitting device according to the fourth embodiment of the invention.

FIG. 30 is a schematic view illustrating another example of the planar pattern of the insulating film 80.

In this embodiment, a circular insulating film 81 is provided on a portion opposed to the first electrode 22. Plural rhombic insulating films 84 are provided around the insulating film 81.

Figure 31:
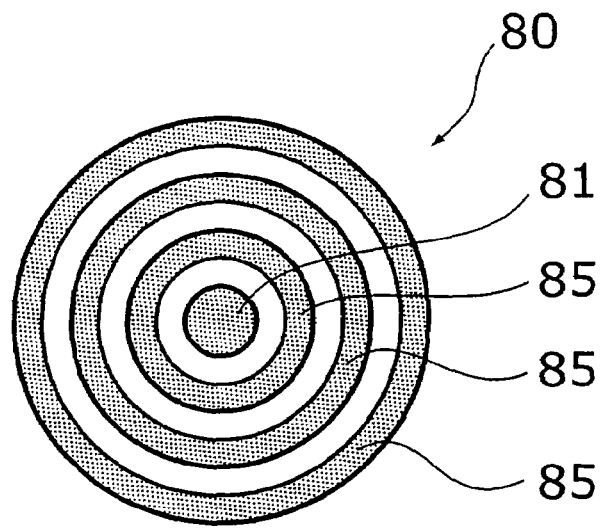
FIG. 31 is a schematic view illustrating another example of the planar pattern of the insulating film of the semiconductor light emitting device according to the fourth embodiment of the invention.

FIG. 31 is a schematic view illustrating another example of the planar pattern of the insulating film 80.

In this embodiment, a circular insulating film 81 is provided on a portion opposed to the first electrode 22. Plural ring-shaped insulating films 85 are provided around the insulating film 81.

Figure 32:
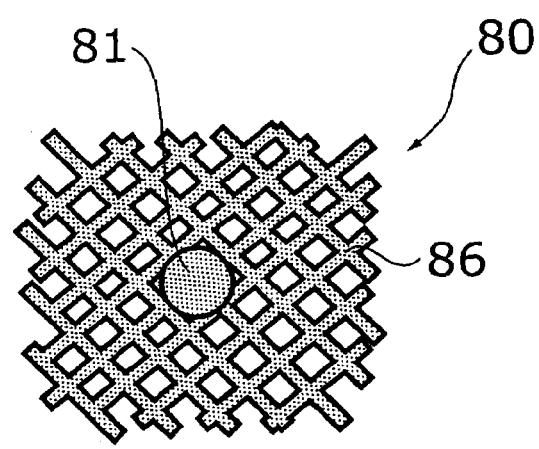
FIG. 32 is a schematic view illustrating another example of the planar pattern of the insulating film of the semiconductor light emitting device according to the fourth embodiment of the invention.

FIG. 32 is a schematic view illustrating another example of the planar pattern of the insulating film 80.

In this embodiment, a circular insulating film 81 is provided on a portion opposed to the first electrode 22. Plural cross-line-shaped insulating films 86 are provided, around the insulating film 81.

Figure 33:
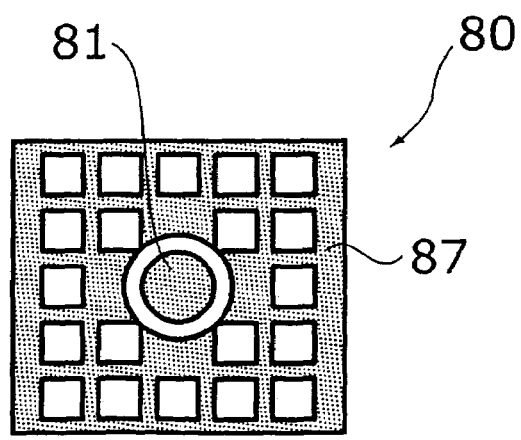
FIG. 33 is a schematic view illustrating another example of the planar pattern of the insulating film of the semiconductor light emitting device according to the fourth embodiment of the invention.

FIG. 33 is a schematic view illustrating another example of the planar pattern of the insulating film 80.

In this embodiment, a circular insulating film 81 is provided on a portion opposed to the first electrode 22. Plural lattice-shaped insulating films 87 are provided around the insulating film 81.

The planar configuration of the insulating film 81 provided on a portion opposed to the first electrode 22, is not limited circular and may be rectangular.

FIFTH EMBODIMENT

Next, a fifth embodiment of the invention is described with reference to an example application to a semiconductor light emitting apparatus equipped with the semiconductor light emitting device. More specifically, any of the semiconductor light emitting devices having high light extraction efficiency described above with reference to the first, second and fourth embodiments (these semiconductor light emitting devices being hereinafter denoted collectively by reference numeral 101) can be mounted on a mounting member such as a lead frame or mounting board to obtain a high-brightness semiconductor light emitting apparatus.

Figure 24:
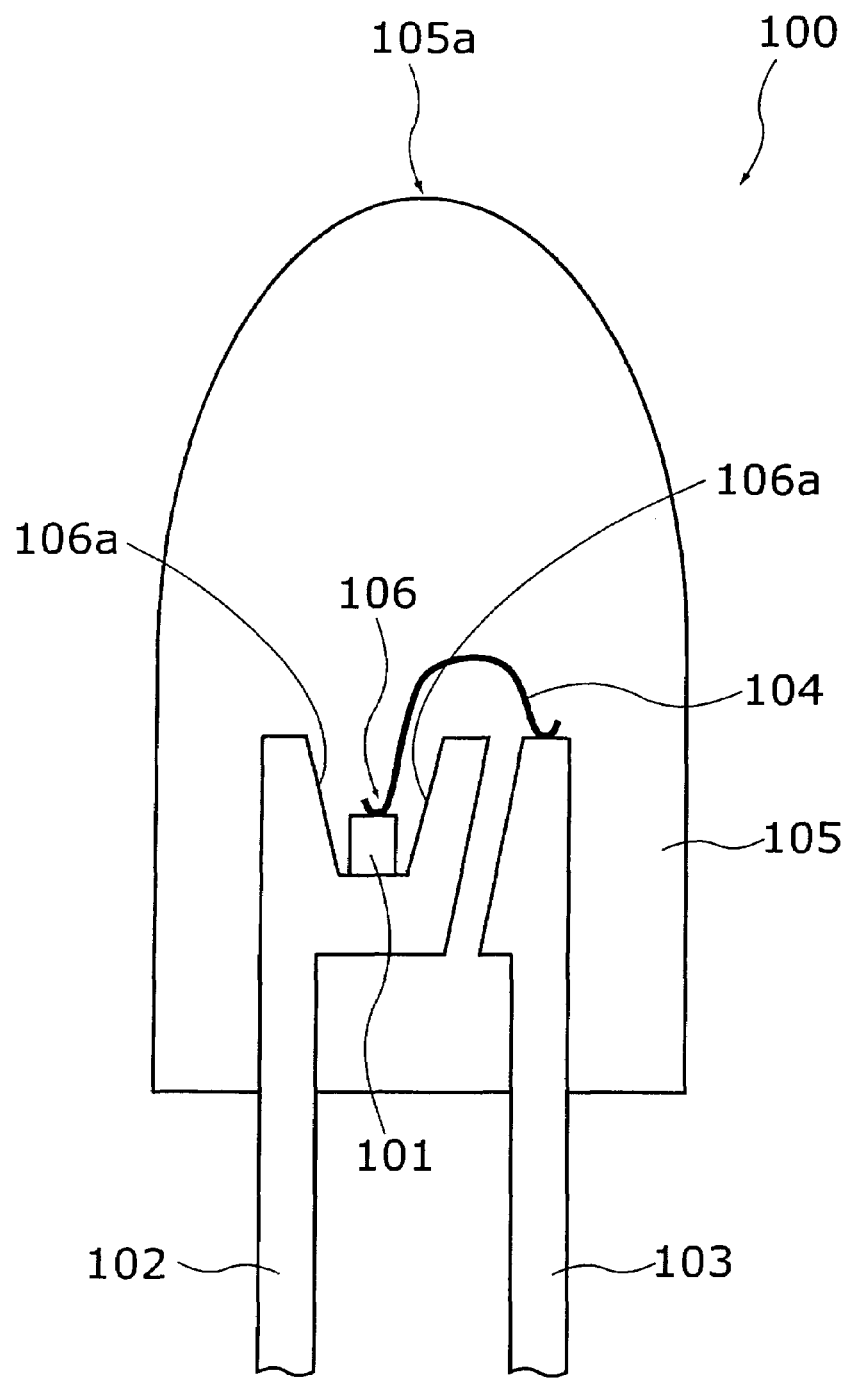
FIG. 24 is a schematic view illustrating the cross-sectional structure of the relevant part of a semiconductor light emitting apparatus according to a fifth embodiment of the invention.

FIG. 24 is a schematic cross section showing an example semiconductor light emitting apparatus of the fifth embodiment. More specifically, the semiconductor light emitting apparatus 100 of this example is a resin-sealed semiconductor light emitting apparatus called the "bullet-shaped" type.

A cup portion 106 is provided on top of a lead 102. The semiconductor light emitting device 101 is mounted on the bottom face of the cup portion 106 with conductive paste or the like. The electrode (bonding pad) on the top side of the semiconductor light emitting device 101 is electrically connected to another lead 103 using a wire 104. The inner wall 106a of the cup portion 106 constitutes a light reflecting surface, which reflects light emitted from the semiconductor light emitting device 101 and allows the light to be extracted upward.

The cup portion 106 is sealed with a translucent resin 105. The light extraction surface 105a of the resin 105 forms a condensing surface, which can appropriately condense the light emitted from the semiconductor light emitting device 101 to achieve a predetermined light distribution.

Figure 25:
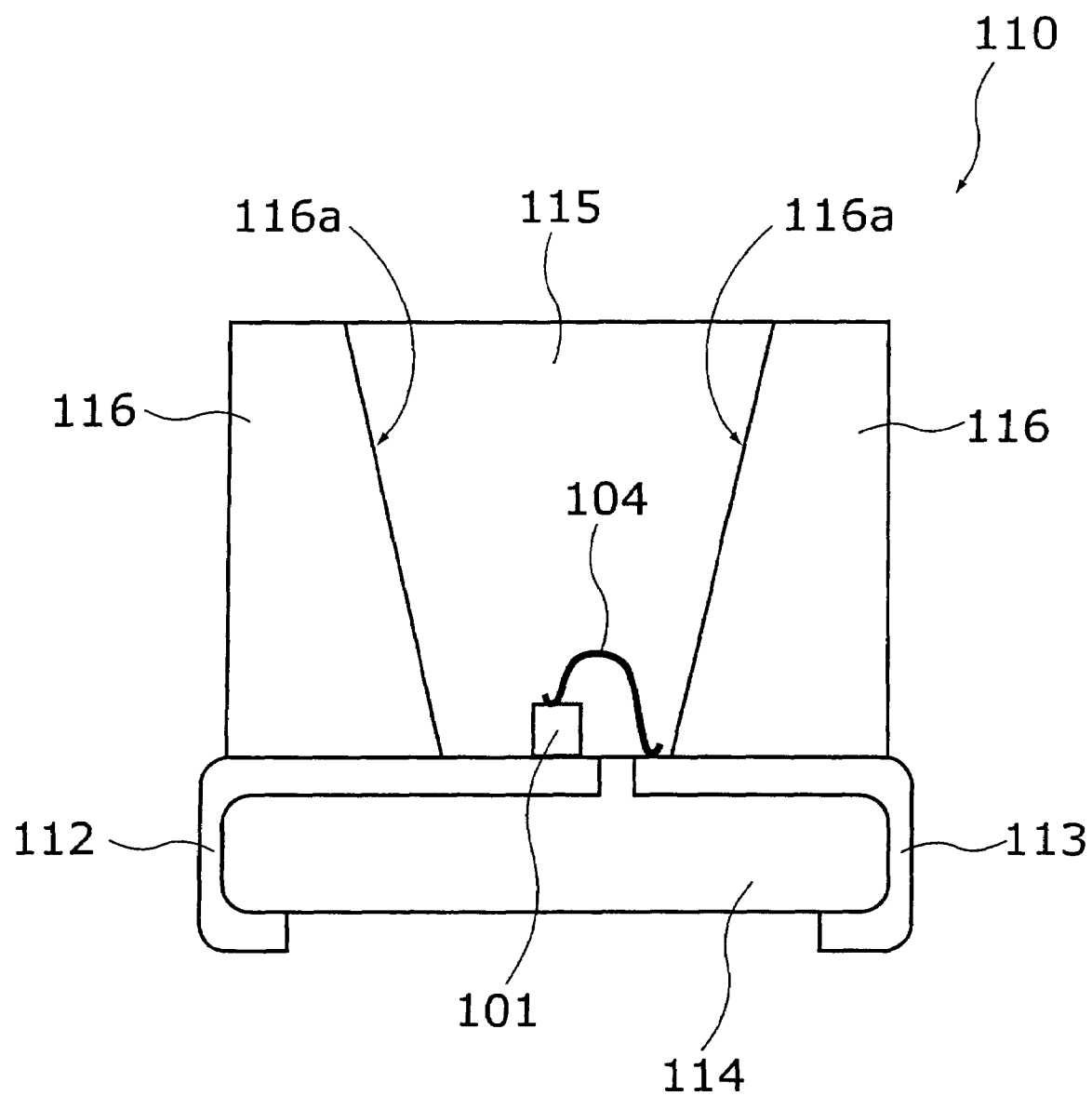
FIG. 25 is a schematic view illustrating the cross-sectional structure of the relevant part of another semiconductor light emitting apparatus according to the fifth embodiment of the invention.

FIG. 25 is a schematic cross section showing another example of the semiconductor light emitting apparatus. The semiconductor light emitting apparatus 110 of this example is called the "surface mounted" type. The semiconductor light emitting device 101 is mounted on a lead 112 via conductive paste or the like. The electrode (bonding pad) on the top side of the semiconductor light emitting device 101 is electrically connected to another lead 113 using a wire 104. These leads 112 and 113 are molded in a first resin 116. The semiconductor light emitting device 101 is sealed with a second, translucent resin 115. The first resin 116 has an enhanced light reflectivity by dispersion of fine particles of titanium oxide, for example. Its inner wall 116a acts as a light reflecting surface to guide the light emitted from the semiconductor light emitting device 101 to the outside.

Figure 26:
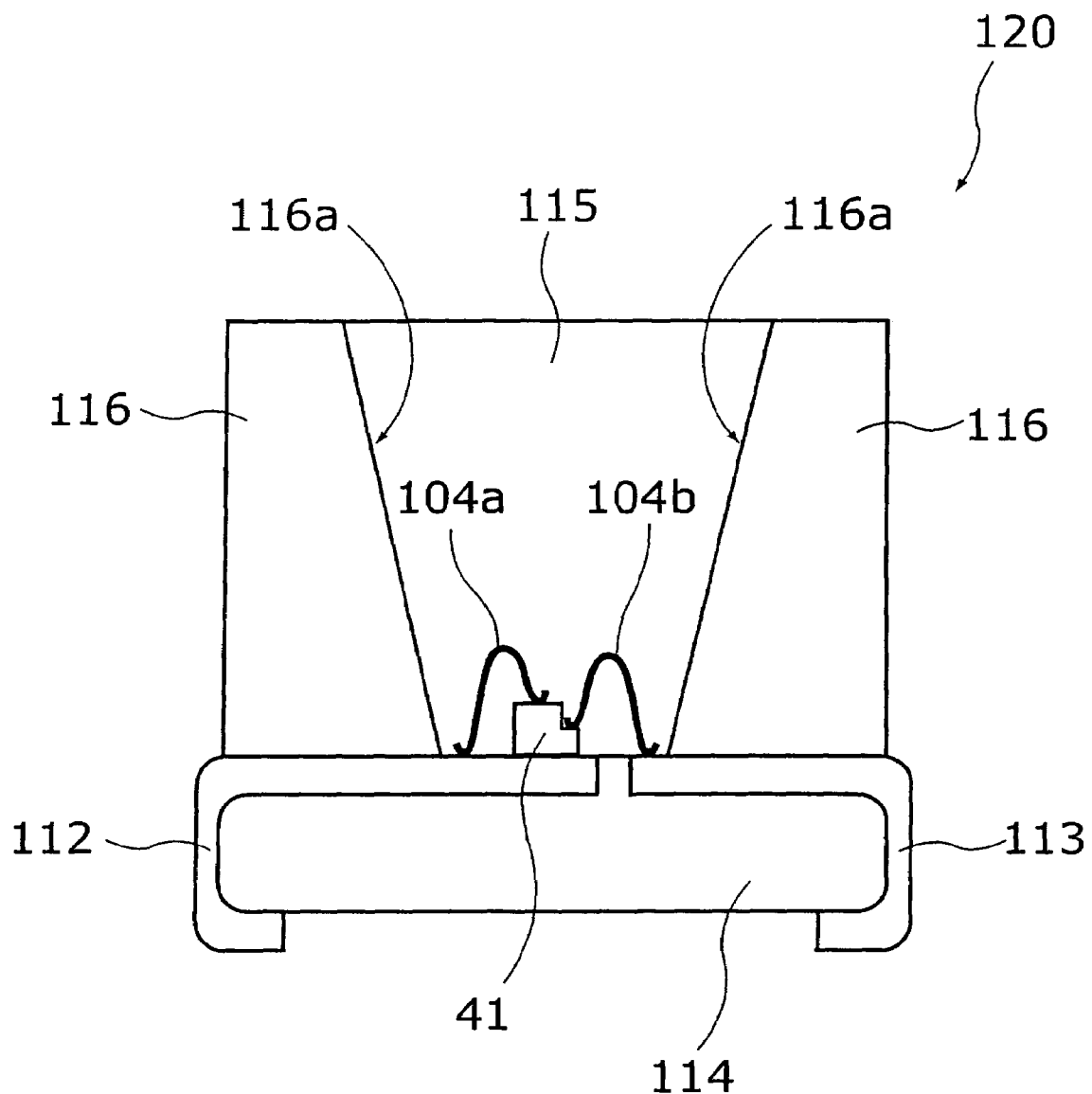
FIG. 26 is a schematic cross section showing another example of the semiconductor light emitting apparatus.

FIG. 26 is a schematic cross section showing another example of the semiconductor light emitting apparatus.

The semiconductor light emitting apparatus 120 of this example has the semiconductor light emitting device 41 shown in FIG. 23.

The first electrode 22 of the semiconductor light emitting device 41 is electrically connected to the lead 112 using a wire 104a. The second electrode 43 of the semiconductor light emitting device 41 is electrically connected to the lead 113 using a wire 104b.

Embodiments of the invention have been described with reference to the examples. However, the invention is not limited thereto, but various modifications can be made on the basis of the spirit of the invention.

The method of roughening the contact layer or the transparent electrode layer is not limited to the methods and conditions described above. For example, a hydrofluoric acid or a hydrochloric acid based etching liquid can also be used to etch the transparent electrode layer 33 made of ITO. Instead of wet etching, dry etching can also be used for roughening the transparent electrode layer 33 made of ITO. The contact layer 12 made of GaAs or the like can also be roughened by wet etching illustratively using a phosphoric acid based etching liquid, besides dry etching. The contact layer 12 or the transparent electrode layer 33 can also be roughened by control of film forming condition such as temperature.

The invention claimed is:

1. A semiconductor light emitting device comprising:
  a semiconductor laminated body including a light emitting layer and having a first major surface and a second major surface located on the opposite side of the first major surface, a light emitted from the light emitting layer being extracted through the first major surface;
  an electrode provided on the first major surface of the semiconductor laminated body;
  a reflecting layer provided on the second major surface side of the semiconductor laminated body, the reflecting layer being conductive and reflective of the light emitted from the light emitting layer; and
  an insulating film selectively provided between the second major surface of the semiconductor laminated body and the reflecting layer,
  at least a portion of the reflecting layer having irregularities, the portion being opposed to the electrode.

2. A semiconductor light emitting device according to claim 1, wherein a refractive index of the insulating film is lower than a refractive index of the semiconductor laminated body.

3. A semiconductor light emitting device according to claim 1, wherein the insulating film is made of one selected from the group consisting of silicon oxide, silicon nitride and silicon oxynitride.

4. A semiconductor light emitting device comprising;
  a semiconductor laminated body including a light emitting layer and having a first major surface and a second major surface located on the opposite side of the first major surface, a light emitted from the light emitting layer being extracted through the first major surface;
  an electrode provided on the first major surface of the semiconductor laminated body; and
  a reflecting layer provided on the second major surface side of the semiconductor laminated body, the reflecting layer being conductive and reflective of the light emitted from the light emitting layer; and
  at least a portion of the reflecting layer having irregularities, the portion being opposed to the electrode, wherein
  the second major surface of the semiconductor laminated body is roughened, and
  the second major roughened surface is formed on a layer made of GaAs or GaP.

5. A semiconductor light emitting device comprising;
  a semiconductor laminated body including a light emitting layer and having a first major surface and a second major surface located on the opposite side of the first major surface, a light emitted from the light emitting layer being extracted through the first major surface;
  an electrode provided on the first major surface of the semiconductor laminated body; and
  a reflecting layer provided on the second major surface side of the semiconductor laminated body, the reflecting layer being conductive and reflective of the light emitted from the light emitting layer; and
  a metal compound layer provided between the semiconductor laminated body and the reflecting layer,
  at least a portion of the reflecting layer having irregularities, the portion being opposed to the electrode.

6. A semiconductor light emitting device according to claim 5, wherein the reflecting layer includes two metal layers, the two metal layers being laminated and bonded.

7. A semiconductor light emitting device according to claim 5, wherein the metal compound layer is conductive, and transparent to light emitted from the light emitting layer.

8. A semiconductor light emitting device according to claim 5, wherein a surface in contact with the reflecting layer of the metal compound layer is roughened.

9. A semiconductor light emitting apparatus comprising:
  a mounting member;
  a semiconductor light emitting device mounted on the mounting member, the semiconductor light emitting device having:
    a semiconductor laminated body including a light emitting layer and having a first major surface and a second major surface located on the opposite side of the first major surface, a light emitted from the light emitting layer being extracted from the first major surface;
    an electrode provided on the first major surface of the semiconductor laminated body; and
    a reflecting layer provided on the second major surface side of the semiconductor laminated body, the reflecting layer being conductive and reflective of the light emitted from the light emitting layer,
    at least a portion of the reflecting layer having irregularities, the portion being opposed to the electrode; and
  a resin sealing the semiconductor light emitting device,
  wherein the semiconductor light emitting device further comprises an insulating film selectively provided between the second major surface of the semiconductor laminated body and the reflecting layer.

10. A semiconductor light emitting apparatus comprising:
  a mounting member;
  a semiconductor light emitting device mounted on the mounting member, the semiconductor light emitting device having:

a semiconductor laminated body including a light emitting layer and having a first major surface and a second major surface located on the opposite side of the first major surface, a light emitted from the light emitting layer being extracted from the first major surface;

an electrode provided on the first major surface of the semiconductor laminated body; and a reflecting layer provided on the second major surface side of the semiconductor laminated body, the reflecting layer being conductive and reflective of the light emitted from the light emitting layer, at least a portion of the reflecting layer having irregularities, the portion being opposed to the electrode; and a resin sealing the semiconductor light emitting device, wherein the semiconductor light emitting device further comprises a metal compound layer provided between the semiconductor laminated body and the reflecting layer.

* * * * *